(12) United States Patent
Pandiyan et al.

(10) Patent No.: US 12,736,570 B2
(45) Date of Patent: Sep. 15, 2026

(54) VAPOR CELLS HAVING OPTICAL WINDOWS WITH MULTILAYER COATINGS

(71) Applicant: Quantum Valley Ideas Laboratories, Waterloo (CA)

(72) Inventors: Rajesh Pandiyan, Kitchener (CA); Sean Michael O'Neill, Elora (CA); James P. Shaffer, Kitchener (CA)

(73) Assignee: Quantum Valley Ideas Laboratories, Waterloo (CA)

( * ) Notice: Subject to any disclaimer, the term of this patent is extended or adjusted under 35 U.S.C. 154(b) by 0 days.

(21) Appl. No.: 19/381,967

(22) Filed: Nov. 6, 2025

(65) Prior Publication Data

US 2026/0126479 A1 May 7, 2026

Related U.S. Application Data

(60) Provisional application No. 63/717,686, filed on Nov. 7, 2024.

(51) Int. Cl.
*G01R 29/08* (2006.01)
*G01N 22/00* (2006.01)
(Continued)

(52) U.S. Cl.
CPC ......... *G01R 29/0885* (2013.01); *G01N 22/00* (2013.01); *G01N 24/008* (2013.01);
(Continued)

(58) Field of Classification Search
CPC ............ G01R 29/0885; G01R 31/2822; G01R 33/323; G01N 22/00; G01N 24/008; G01N 2203/0641; H05H 1/46; Y10S 427/104
(Continued)

(56) References Cited

U.S. PATENT DOCUMENTS 10,466,524 B2 11/2019 Tonar et al.
10,564,201 B1 2/2020 Shaffer
(Continued)

FOREIGN PATENT DOCUMENTS

WO 2015094243 6/2015

OTHER PUBLICATIONS

Adams, et al., "Rydberg atom quantum technologies", J. Phys. B: At. Mol. Opt Phys. 53, Dec. 3, 2019, 14 pgs.
(Continued)

*Primary Examiner* — Raul J Rios Russo
(74) *Attorney, Agent, or Firm* — Henry Patent Law Firm PLLC

(57) ABSTRACT

In a general aspect, vapor cells are disclosed that include a dielectric body and an optical window. The dielectric body has a cavity and an exterior surface that defines an opening to the cavity. The optical window includes a substrate and first and second multilayer coatings. In some aspects, the substrate has first and second substrate surfaces on opposite sides of the substrate, and the first and second multilayer coatings are disposed on, respectively, the first and second substrate surfaces. The first multilayer coating defines a first window surface that is bonded to the exterior surface of the dielectric body and extends across the opening. The second multilayer coating defines a second window surface that faces an exterior of a vapor cell. The first and second multilayer coatings apply, respectively, first and second stresses to the substrate, with the second stress counteracting the first stress.

28 Claims, 15 Drawing Sheets

(51) Int. Cl.

| | |
|---|---|
| ***G01N 24/00*** | (2006.01) |
| ***G01R 31/28*** | (2006.01) |
| ***G01R 33/32*** | (2006.01) |
| ***H05H 1/46*** | (2006.01) |

(52) U.S. Cl.
CPC .. *G01N 2203/0641* (2013.01); *G01R 31/2822* (2013.01); *G01R 33/323* (2013.01); *H05H 1/46* (2013.01); *Y10S 427/104* (2013.01)

(58) Field of Classification Search
USPC ........................................................... 324/96
See application file for complete search history.

(56) References Cited

U.S. PATENT DOCUMENTS

| | | | |
|---|---|---|---|
| 10,605,840 B1 | 3/2020 | Amarloo et al. | |
| 11,300,599 B1 | 4/2022 | Amarloo et al. | |
| 11,307,233 B1 | 4/2022 | Amarloo et al. | |
| 11,313,926 B1 | 4/2022 | Amarloo et al. | |
| 11,320,588 B1 | 5/2022 | Mazed | |
| 11,366,430 B2 | 6/2022 | Ramirez-serrano et al. | |
| 2011/0232782 A1* | 9/2011 | Borwick, III | G04F 5/145 137/551 |
| 2021/0114926 A1* | 4/2021 | Ramirez-Serrano | G01R 29/0864 |
| 2021/0132549 A1* | 5/2021 | Ramirez-Serrano | H01S 1/06 |
| 2021/0156898 A1* | 5/2021 | Amarloo | G01R 33/032 |
| 2021/0255226 A1* | 8/2021 | Amarloo | B82Y 20/00 |
| 2023/0029614 A1* | 2/2023 | Hughes | C03B 23/20 |

OTHER PUBLICATIONS

Apfel, Josephh. , "Optical coating design with reduced electric field intensity", Appl. Opt. 16, 1977, 6 pages.

Bohaichuk, et al., "A Three-Photon Rydberg Atom-Based Radio Frequency Sensing Scheme with Narrow Linewidth", arXiv:2304. 07409 [physics.atom-ph] (2023), 2023, 11 pages.

Fan, et al., "Atom based RF electric field sensing", Journal of Physics B: Atomic, Molecular and Optical Physics 48 202001 (2015), Sep. 9, 2015, 17 pgs.

Fan, et al., "Effect of Vapor-Cell Geometry on Rydberg-Atom-Based Measurements of Radio-Frequency Electric Fields", Physical Review Applied 4, 044015 (2015), 2015, 7 pgs.

MacLeod, Angush. , "Thin Film Optical Filters", Fourth Edition, CRC Press, 2010, 791 pages.

Noaman, et al., "Vapor Cell Characterization and Optimization for Applications in Rydberg Atom-Based Radio Frequency Sensing", Proceedings vol. 12447, Quantum Sensing, Imaging, and Precision Metrology; 124470V (2023), Mar. 8, 2023, 6 pages.

Oliver, et al., "Plasma-ion-assisted coatings for 15 femtosecond laser systems", Appl. Opt. 53, https://doi.org/10.1364/AO.53.00A221, 2014, 10 pages.

Sedlacek, et al., "Quantum Assisted Electrometry using Bright Atomic Resonances", arXiv:1205.4461v1 [physics.atom-ph], May 20, 2012, 15 pgs.

Shaffer, et al., "A read-out enhancement for microwave electric field sensing with Rydberg atoms", Proc. SPIE vol. 10674, Quantum Technologies 2018, 2018, 12 pgs.

Thelen, Alfred, "Design of Optical Minus Filters", Journal of the Optical Society of America, vol. 61, No. 3, Mar. 1971, 5 pages.

ISA, International Search Report and Written Opinion issued in Application PCT/CA2025/051475 on Mar. 4, 2026, 10 pages.

* cited by examiner

400

| Glass Substrate (0.5 mm) | | Glass Substrate (0.5 mm) | |
|---|---|---|---|
| Front side Layers | Thickness (nm) | Back side Layers | Thickness (nm) |
| H | 18 | H | 14 |
| L | 27 | L | 30 |
| H | 10 | H | 10 |
| L | 41 | L | 45 |
| H | 17 | H | 14 |
| L | 115 | L | 145 |
| Air | - | Air | - |

VAPOR CELLS HAVING OPTICAL WINDOWS WITH MULTILAYER COATINGS

CROSS-REFERENCE TO RELATED APPLICATIONS

This application claims priority to U.S. Prov. Pat. App. No. 63/717,686, which was filed on Nov. 7, 2024, and entitled, "Bonding Vapor Cells That Have Optical Coatings." The disclosure of the priority application is hereby incorporated herein by reference in its entirety.

GOVERNMENT LICENSE RIGHTS

This invention(s) was made with U.S. government support as part of the "Science of Atomic Vapors for New Technologies" (SAVaNT) program under Contract No. HR00112190080 to the Defense Advanced Research Projects Agency (DARPA). The U.S. government has certain rights in the invention(s).

BACKGROUND

The following description relates to vapor cells that have optical windows with multilayer coatings.

Vapor cells can be manufactured by sealing a vapor within an enclosed volume. The vapor can be used as a medium to interact with electromagnetic fields that are incident on the vapor cell. Beams of light generated by lasers can be directed through the vapor to probe and measure the response of the vapor to the electromagnetic fields. In this way, a vapor cell can be used to determine properties of the electromagnetic fields.

DESCRIPTION OF DRAWINGS

FIG. 4 is a table showing examples of thicknesses for multilayer films that are stacked on both sides of a glass substrate;

DETAILED DESCRIPTION

Figure 1A:
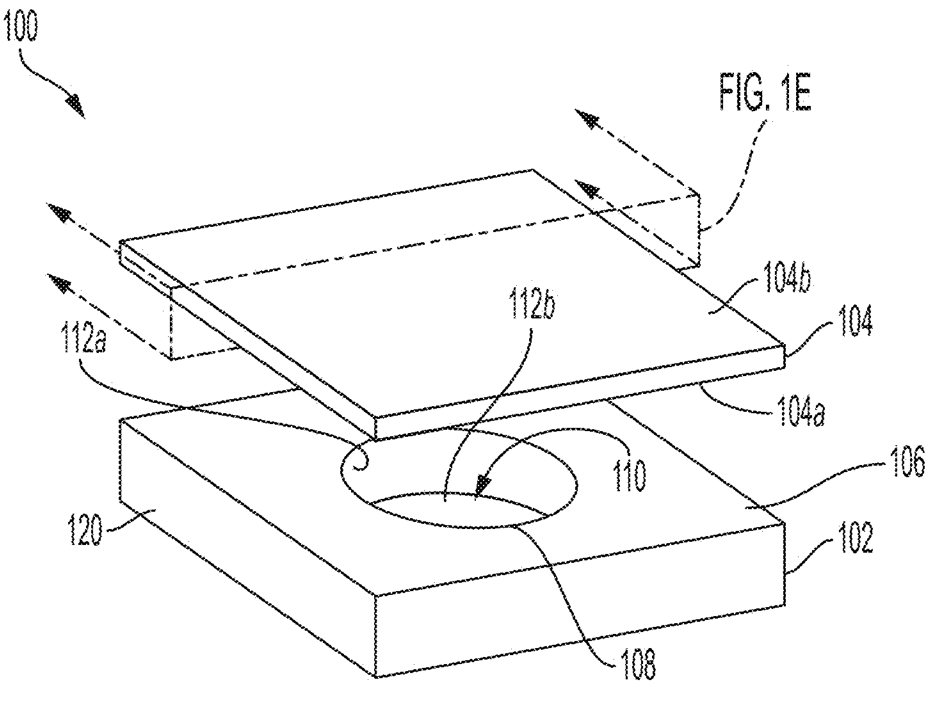
FIG. 1A is a schematic diagram, in exploded perspective view, of an example vapor cell having a dielectric body and an optical window.

In a general aspect, vapor cells are described that include optical windows with multilayer coatings thereon. Bonding processes for the optical windows are also described, and these bonding processes may correspond to wafer bonding processes in certain cases. The vapor cells may be engineered to enhance the transmission of light (e.g., laser signals) through the optical windows, and in many instances, into a cavity of the vapor cells. Moreover, the bonding processes may include applying the multilayer coatings to the optical windows of the vapor cells. In certain configurations, the vapor cells may be MEMs-type vapor cells. The optical windows may be configured to ensure that the vapor cells form high-quality, hermetically sealed bonds using the bonding processes. These bonds, formed at low temperatures, can seal an atomic or molecular vapor species inside the vapor cells. In some implementations, the bonding processes include the formation of covalent bonds at a bonding interface, such as siloxane Si—O—Si and nitroso bonds. The bonding interface could, for example, include layers of amorphous silicon and silicon oxide disposed on, respectively, glass and silicon substrates (e.g., a glass /a-Si//$SiO_2$/Si structure where // represents the bonding interface). The bonding processes may also use layers that, when formed on opposite sides of a window substrate, balance the stresses on each side to maintain a flatness of the window substrate. Such flatness may significantly improve the ability of the optical windows to form seals when bonded to a dielectric body of the vapor cells.

The bonding processes may include operations for forming optical coatings on one or more the optical windows of a vapor cell. Moreover, the structure of the vapor cell may, in certain cases, include a glass-silicon-glass stack (e.g., a wafer stack) in which the two glass layers act as respective optical windows for the transmission of light. This light may interact with a vapor of the vapor cell (e.g., a vapor of atoms or molecules contained in the vapor cell). In some instances, the silicon layer may define a frame that determines the geometry of the vapor cell. The bonding processes are also applicable in cases where the silicon frame is replaced with a glass frame, or for other materials like sapphire, such as when using adhesion layers.

In many implementations, the bonding processes integrate multilayer coatings that can be configured as, for example, antireflection (AR) coatings, filters, and reflectors on the optical windows of the vapor cells. These multilayer coatings can be tailored as needed based on their optical application. In some implementations, the vapor cells may use a sputtered amorphous silicon (a-Si) film as an adhesion layer to bond the multi-layer coated optical window to the frame of the vapor cells. In some instances, a single multilayer coating may be configured as an antireflection coating for a particular color of light and a reflector (or alternatively, a filter) for a different color of light.

The multilayer coatings on the optical windows of the vapor cells can provide a solution to mitigate reflection losses and increase the transmission of an optical signal (e.g., a laser signal) passing through the vapor cells. For example, when configured as anti-reflective coatings, the multilayer coatings may minimize reflections that can feedback to the laser, which in turn, can affect the linewidth of the laser. When configured as filter coatings, the multilayer coatings can be used to suppress the transmission of some wavelengths of light through the vapor cell. When configured as reflection coatings, the multilayer coatings can allow the recycling of the light through the vapor cell. Other benefits are possible. In general, the multilayer coatings can be designed to have one or more optical properties (e.g., antireflection, reflection, filtering, polarization, etc.) by changing the thickness, composition, and number of layers in a coating.

By integrating multilayer coatings with vapor cells, the optical transmission and reflection can be designed to significantly improve the performance of the vapor cells, especially when configured for use as atomic clocks, magnetic field sensors, and Rydberg atom electric field sensors. Moreover, the multilayer coatings are designed to distribute the stress over both sides of an optical window so that warping of the optical window is minimized. In some variations, one or more layers in the multilayer coatings are treated to reduce their surface roughness. Further, the deposition of an ultra-thin layer of a-Si film on top of the bonding surface of an optical window can allow a strong, hermetic and reliable bond, even at low bonding temperatures.

In some implementations, the bonding processes include one, some, or all of the following operations: (1) selecting materials and designing the multilayer coating (MC), which may include distributing the stress across both sides of a optical window; (2) depositing the multilayer coating on both sides of the optical window, possibly including an ion treatment to reduce its surface roughness; (3) depositing an ultra-thin layer of a-Si with low surface roughness as a bonding interfacial layer on top of the multilayer coating; (4) thermally oxidizing a surface of a silicon wafer to form $SiO_2$; and (5) bonding the wafer pairs of MC/glass/MC/a-Si//with a $SiO_2$/silicon substrate at temperatures around 250° C. or less (e.g., via hybrid bonding processes). As used herein, "//" refers to a bonding interface, and "/" refers to an interface. As discussed further below, finished multilayer coatings can, in many cases, be manufactured as anti-reflective coatings with a maximum reflectance of 0 to 2% at a 0° incident angle in the wavelength range from 500 to 540 nm. The finished multilayer coatings can also be fabricated to have a maximum reflectance of 0 to 2% at a 0° incident angle in the wavelength range of 800-nm to 900-nm. Other wavelength ranges are possible. Moreover, the bond strength, interface integrity and fracture toughness of the bonded pairs AR/glass/AR/a-Si//with $SiO_2$/silicon can be evaluated using the crack-opening test by razor blade and/or dicing, cleaving, and so forth.

Figure 1B:
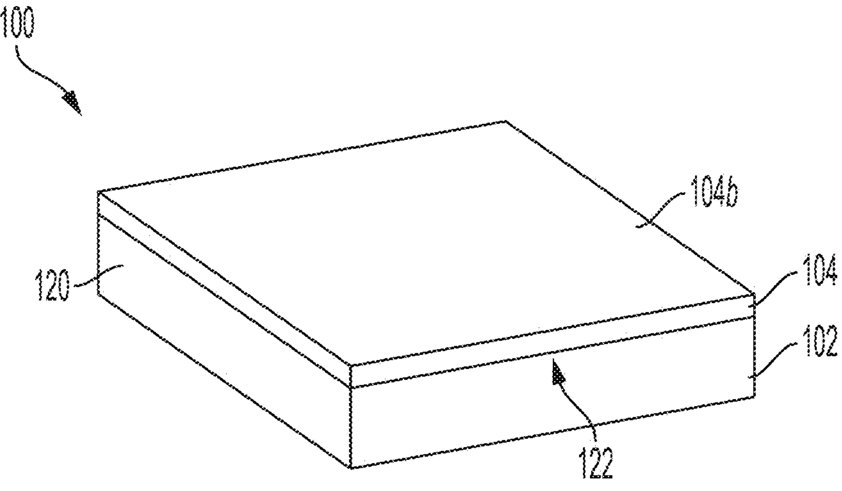
FIG. 1B is a schematic diagram, in perspective view, of the example vapor cell of FIG. 1A, but in which the optical window is bonded to the dielectric body.

Now referring to FIG. 1A, a schematic diagram is presented, in exploded perspective view, of an example vapor cell 100 having a dielectric body 102 and an optical window 104. FIG. 1B presents a schematic diagram, in perspective view, of the example vapor cell 100 of FIG. 1A, but in which the optical window 104 is bonded to the dielectric body 102. The dielectric body 102 may be a substrate (e.g., a wafer) defined by planar surfaces on opposite sides of the dielectric body 102, as shown in FIGS. 1A-1B. However, other configurations are possible for the dielectric body 102. Moreover, although FIGS. 1A-1B depict the dielectric body 102 as being square, other shapes are possible. The optical window 104 may also be a substrate (e.g., a wafer) defined by planar surfaces. However, other configurations are possible for the optical window 104. In general, the optical window 104 includes one surface adapted to mate (or bond) with a surface of the dielectric body 102, thereby allowing a seal to form (e.g., via a bond along a bonded interface).

The dielectric body 102 may be formed of a material transparent to electromagnetic fields (e.g., from electromagnetic radiation) that are measured by the example vapor cell 100. The material may be an insulating material having a high resistivity, e.g., $\rho > 10^8\ \Omega\cdot cm$, and may also correspond to a single crystal, a polycrystalline ceramic, or an amorphous glass. For example, the dielectric body 102 may be formed of silicon. In another example, the dielectric body 102 may be formed of a glass that includes silicon oxide (e.g., $SiO_2$, $SiO_x$, etc.), such as vitreous silica, a borosilicate glass, or an aluminosilicate glass. In some instances, the material of the dielectric body 102 is a metal oxide material such as magnesium oxide (e.g., MgO), aluminum oxide (e.g., $Al_2O_3$), silicon dioxide (e.g., $SiO_2$), titanium dioxide (e.g., $TiO_2$), zirconium dioxide, (e.g., $ZrO_2$), yttrium oxide (e.g., $Y_2O_3$), lanthanum oxide (e.g., $La_2O_3$), and so forth. The metal oxide material may be non-stoichiometric (e.g., $SiO_x$) and may also be a combination of one or more binary oxides (e.g., $Y{:}ZrO_2$, $LaAlO_3$, etc.). In some implementations, the material of the dielectric body 102 is a non-oxide material such as silicon (Si), diamond (C), gallium nitride (GaN), calcium fluoride (CaF), and so forth.

The dielectric body 102 includes an exterior surface 106 that defines an opening 108 to a cavity 110 in the dielectric body 102. The exterior surface 106 may be a planar surface, as shown in FIGS. 1A-1B, although other surfaces are possible (e.g., curved). The opening 108 may be any type of opening that allows access to an internal volume of the cavity 110 and may have any shape (e.g., circular, square, hexagonal, oval, etc.). Such access may allow a vapor (or a source of vapor) to be disposed into the cavity 110 during manufacture of the example vapor cell 100. The dielectric body 102 also includes an interior surface 112 that defines the cavity 110 in the dielectric body 102. In FIG. 1A, the interior surface 112 has two sub-surfaces 112*a*, 112*b* although other numbers of sub-surfaces are possible (e.g., one, three, four, etc.). The cavity 110 extends from the exterior surface 106 into the dielectric body 102 and stops at the sub-surface 112*b* before extending completely through the dielectric body 102. The cavity 110 may have a uniform cross-section along its extension through the dielectric body 102. However, the cross-section of cavity 110 may vary along its extension in certain cases.

The example vapor cell 100 includes a vapor (not shown) in the cavity 110 of the dielectric body 102. The vapor may include constituents such as a gas of Group IA atoms, a noble gas, a gas of diatomic halogen molecules, or a gas of organic molecules. For example, the vapor may include a gas of alkali metal atoms (e.g., K, Rb, Cs, etc.) and possibly also a noble gas (e.g., He, Ne, Ar, Kr, etc.). If present, the noble gas may serve as a buffer gas in certain cases. In another example, the vapor may include a gas of diatomic halogen molecules (e.g., $F_2$, $Cl_2$, $Br_2$, etc.) and possibly also a noble gas. In yet another example, the vapor may include a gas of organic molecules (e.g., acetylene) and possibly a noble gas. Other combinations for the vapor are possible, including other constituents. In many implementations, the vapor has Rydberg electronic states. For example, the vapor may include a gas of alkali metal atoms having Rydberg electronic states that can interact with an optical signal (e.g., a laser signal), an RF field, or both. Examples of vapors with Rydberg electronic states are described in U.S. Pat. No. 11,112,298 entitled "Vapor Cells for Imaging of Electromagnetic Fields".

Figure 1C:
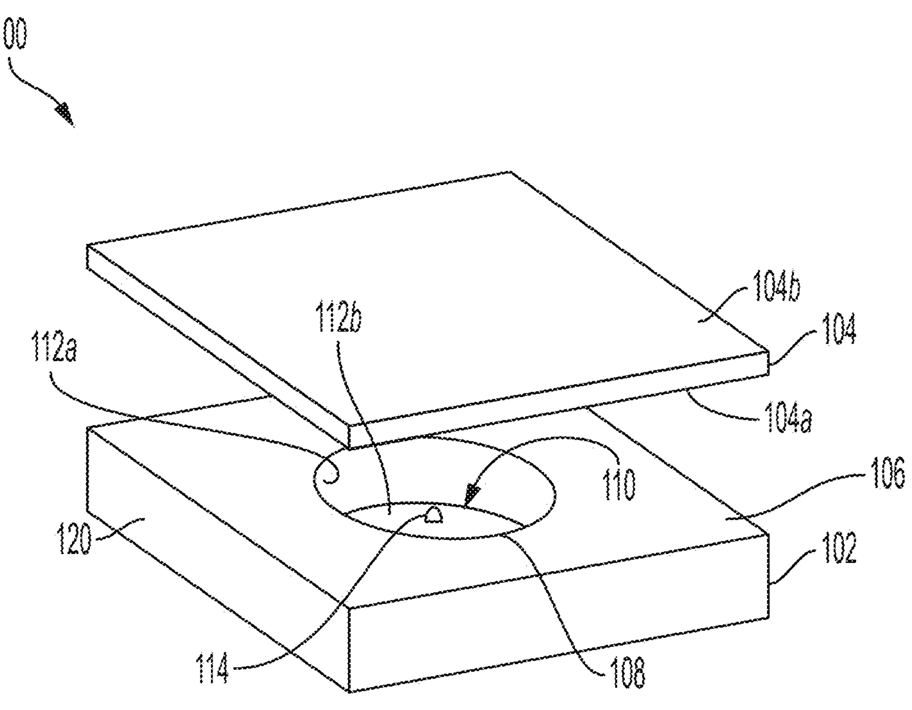
FIG. 1C is a schematic diagram, in exploded perspective view, of the example vapor cell of FIG. 1A, but in which a source of vapor resides in cavity.

In some implementations, the example vapor cell 100 includes a source of the vapor in the cavity 110 of the dielectric body 102. The source of the vapor may generate the vapor in response to an energetic stimulus, such as heat, exposure to ultraviolet radiation, and so forth. FIG. 1C presents a schematic diagram, in exploded perspective view, of the example vapor cell 100 of FIG. 1A, but in which a source of the vapor 114 resides in cavity 110. The source of the vapor 114 may include a liquid or solid source of alkali metal atoms that generates a vapor of the alkali metal atoms when heated or irradiated. For example, the source of the vapor 114 may be an alkali metal mass that is sufficiently cooled to be in a solid or liquid phase when disposed into the cavity 110. In these implementations, laser light may be used to irradiate the alkali metal mass through the optical window 104, thereby heating the alkali metal mass and causing its temperature to increase. In response, the alkali metal mass may generate (e.g., via sublimation, boiling, etc.) a vapor of alkali metal atoms, which then fills the cavity 110. However, other forms are possible for the source of the vapor 114. For example, the source of the vapor 114 could be a chemical compound that decomposes to produce a vapor of alkali metal atoms in response to an energetic stimulus, such as heat, irradiation, and so forth.

Figure 1D:
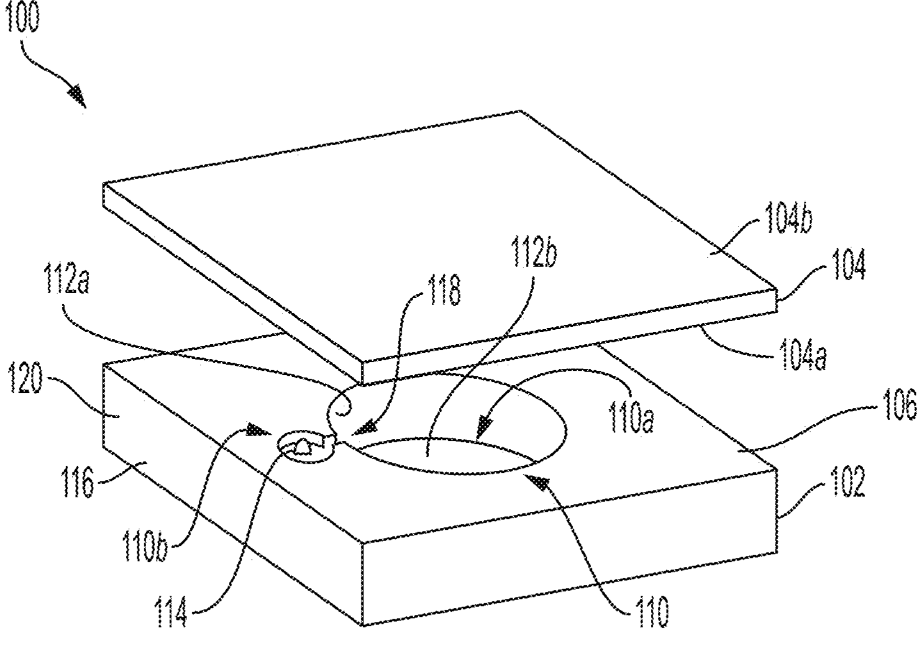
FIG. 1D is a schematic diagram, in exploded perspective view, of the example vapor cell of FIG. 1A, but in which a source of vapor resides in a second chamber of a cavity of the example vapor cell.

In some implementations, the cavity 110 includes a first chamber 110*a* and a second chamber 110*b*. This configuration may allow the example vapor cell 100 to have a region for producing vapor that is separate from a region for sensing electromagnetic fields. For example, as shown in FIG. 1D, the cavity 110 may include a channel 118 that fluidly couples the first and second chambers 110*a*, 110*b* to each other. In these cases, the source of the vapor 114 resides in the second chamber 110*b* of the cavity 110. Moreover, the vapor of alkali metal atoms, when produced by the source of the vapor 114, may diffuse from the second chamber 110*b*, through the channel 118, and into the first chamber 110*a*. In some instances, the second chamber 110*b* may be referred to as a "side pocket" of the example vapor cell 100.

The presence of the second chamber 110*b* may be useful in situations where the source of the vapor 114 leaves a residue after producing the vapor of alkali metal atoms. This residue, if left in the first chamber 110*a*, would be undesirable as the first chamber 110*a* defines the sensing region of the example vapor cell 100. For example, if left in first chamber 110*a*, the residue could interfere with laser light entering in first chamber 110*a* to interact with the vapor of alkali metal atoms. The residue could also interact with the vapor (e.g. via collisions with the alkali metal atoms) to reduce the sensitivity of the example vapor cell 100 to electromagnetic fields. In some implementations, such as shown in FIG. 1D, the second chamber 110*b* is offset from the first chamber 110*a* in the dielectric body 102. For example, the second chamber 110*b* may reside between the first chamber 110*a* and an outer surface 116 of the dielectric body 102. In these cases, the second chamber 110*b* may define a side pocket of the dielectric body 102. Moreover, the outer surface 116 may correspond to an outer side surface of the dielectric body 102, such as the outer perimeter surface 120 on a side wall of the dielectric body 102. However, other types of outer surfaces 116 are possible.

The example vapor cell 100 additionally includes the optical window 104. As shown in FIG. 1B, the optical window 104 covers the opening 108 of the cavity 110 and has a surface 104*a* (e.g., a first window surface) that is bonded to the exterior surface 106 of the dielectric body 102 to form a bonded interface 122 of the example vapor cell 100. This bond forms a seal around the opening 108, and as such, the bonded interface 122 includes the seal. In some implementations, the bond is formed using a hybrid bonding process and includes a metal oxynitride layer disposed along the bonded interface 122 between the exterior surface 106 of the dielectric body 102 and the surface 104*a* of the optical window 104. The metal oxynitride layer may, in certain cases, be a material having a composition of $MO_xN_y$, where M represents the metal(s), x represents the stoichiometry of oxygen, and y represents the stoichiometry of nitrogen. Moreover, the metal oxynitride layer may be formed by reacting metal oxygen (e.g., M—O) and metal nitrogen (e.g., M—N) bonds on the surfaces 106, 104*a* of the dielectric body 102 and the optical window 104 when contacted together. If one or both of the dielectric body 102 (or an interfacial layer thereon) and the optical window 104 include silicon oxide, the metal oxynitride layer may be formed as a silicon oxynitride layer (e.g., a $SiO_xN_y$ material). However, other types of metal oxynitride layers are possible. For example, if the dielectric body 102 and the optical window 104 are both made of sapphire (e.g., $Al_2O_3$), the metal oxynitride layer may be formed as an aluminum oxynitride layer (e.g., a $AlO_xN_y$ material). If the dielectric body 102 is made of a glass that includes silicon oxide and the optical window 104 is made of sapphire, the metal oxynitride layer may be formed as a silico-aluminum oxynitride layer (e.g., a $Si_aAl_bO_xN_y$ material) having two metals (e.g., M=Si and Al).

Figure 1E:
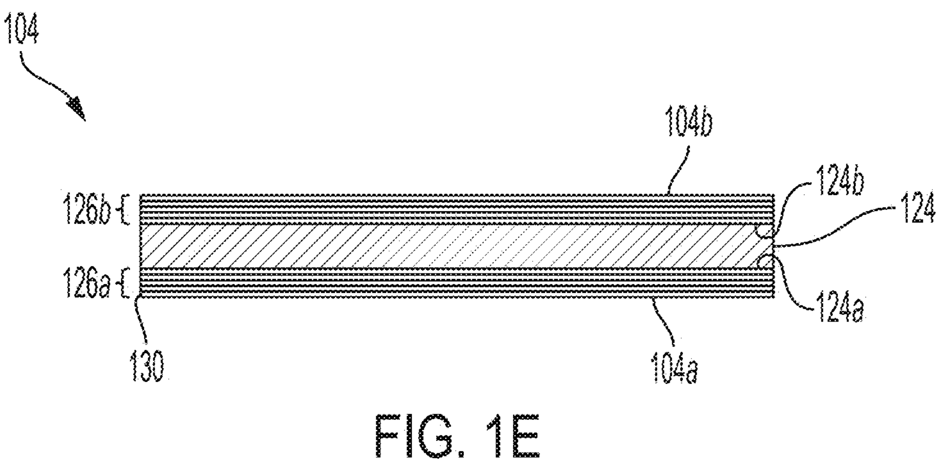
FIG. 1E is a schematic diagram, in cross section view, of the optical window of FIG. 1A, showing a substrate of the optical window and first and second multilayer coatings disposed on respective surfaces of the substrate.

The optical window 104 includes a substrate 124 and two multilayer coatings 126*a*, 126*b*. For example, FIG. 1E presents a schematic diagram, in cross section view, of the optical window 104 of FIG. 1A, showing the substrate 124 of the optical window 104 and first and second multilayer coatings 126*a*, 126*b* disposed on respective surfaces of the substrate 124. The substrate 124 includes first and second substrate surfaces 124*a*, 124*b* on opposite sides of the substrate 124.

The substrate 124 may be formed of a material that is transparent to laser light used to interact with the vapor sealed within the cavity 110 of the dielectric body 102. As such, the substrate 124 may be transparent to a laser wavelength that is matched to a target electronic transition of the vapor (e.g., a target electronic transition of a vapor of alkali metal atoms). Multiple laser wavelengths are possible. For example, the material of the substrate 124 may be transparent to infrared wavelengths of electromagnetic radiation (e.g., 700-1000 nm), visible wavelengths of electromagnetic radiation (e.g., 400-7000 nm), or ultraviolet wavelengths of electromagnetic radiation (e.g., 10-400 nm). Moreover, the material of the substrate 124 may be an insulating material having a high resistivity, e.g., $\rho>10^8\ \Omega\cdot$, and may also correspond to a single crystal, a polycrystalline ceramic, or an amorphous glass. For example, the material of the substrate 124 may include silicon oxide (e.g., $SiO_2$, $SiO_x$, etc.), such as found within quartz, vitreous silica, or a borosilicate glass. In another example, the material of the substrate 124 may include aluminum oxide (e.g., $Al_2O_3$, $Al_xO_y$, etc.), such as found in sapphire or an aluminosilicate glass. In some instances, the material of the substrate 124 is an oxide material such as magnesium oxide (e.g., MgO), aluminum oxide (e.g., $Al_2O_3$), silicon dioxide (e.g., $SiO_2$), titanium dioxide (e.g., $TiO_2$), zirconium dioxide, (e.g., $ZrO_2$), yttrium oxide (e.g., $Y_2O_3$), lanthanum oxide (e.g., $La_2O_3$), and so forth. The oxide material may be non-stoichiometric (e.g., $SiO_x$), and may also be a combination of one or more binary oxides (e.g., $Y{:}ZrO_2$, $LaAlO_3$, etc.). In other instances, the material of the substrate 124 is a non-oxide material such as diamond (C), calcium fluoride (CaF), and so forth.

In many implementations, the first multilayer coating 126*a* is disposed on the first substrate surface 124*a* and defines the first window surface 104*a* of the optical window 104. The first window surface 104*a* is bonded to the exterior surface 106 of the dielectric body 102 and extends across (e.g., covers) the opening 108. Similarly, the second multilayer coating 126*b* is disposed on the second substrate surface 124*b* and defines a second window surface 104*b* of the optical window 104. The second window surface 104*b* faces an exterior of the example vapor cell 100, and in many configurations, resides on a side of the optical window 104 opposite the first window surface 104*a*. FIG. 1E depicts the first and second multilayer coatings 126*a*, 126*b* as being similar in thickness and having the same number of layers. However, the first and second multilayer coatings 126*a*, 126*b* may be different from each other. For example, the coatings 126*a*, 126*b* may have a different number of layers. The thickness of the layers in the coatings 126*a*, 126*b* may also be different and may have different compositions. Other differences are possible. In some implementations, the first and second multilayer coatings 126*a*, 126*b* are each configured as an antireflection coating for the laser wavelength.

In some implementations, the exterior surface 106 of the dielectric body 102 and the first window surface 104*a* of the optical window 104 (e.g., the first multilayer coating 126*a*) may have a root mean square (RMS) surface roughness, $R_q$, no greater than a threshold surface roughness. For example, the first multilayer coating 126*a* may have an RMS surface roughness, $R_q$, no greater than 1 nm. The threshold surface roughness may ensure that, during bonding, pathways are not formed that leak through the seal. Such pathways, if present, might allow contamination to enter the cavity 110 and/or vapor to exit the vapor cell 100. In some variations, the threshold surface roughness is less than 50 nm. In some variations, the threshold surface roughness is less than 30 nm. In some variations, the threshold surface roughness is less than 10 nm. In some variations, the threshold surface roughness is less than 1 nm.

Figure 1F:
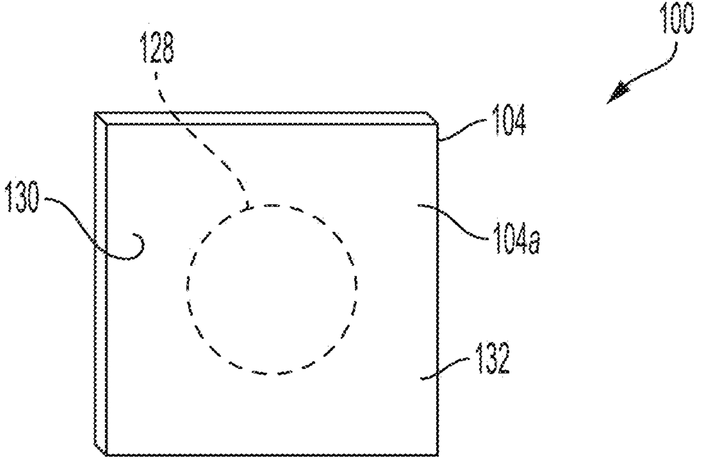
FIG. 1F is a schematic diagram, in exploded perspective view, of the example vapor cell of FIG. 1A, but in which the optical window includes covering and bonding portions.
Figure 1F:
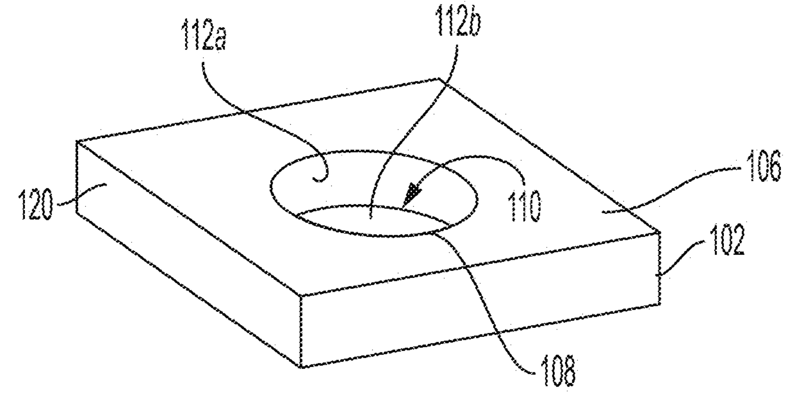

In some implementations, such as shown in FIG. 1F, the first window surface 104*a* of the optical window 104 includes a covering portion 128 that extends across the opening 108 of the cavity 110. In these implementations, the first multilayer coating 126*a* may include an end layer 130 that includes the covering portion 128 as well as a bonding portion 132 that is bonded to the exterior surface 106 of the dielectric body 102.

In certain cases, the end layer 130 may be an adhesion layer that facilitates bonding to the exterior surface 106 of the dielectric body 102. For example, the dielectric body 102 may be formed of silicon (e.g., be a silicon dielectric body) and include a silicon oxide layer that defines the exterior surface 106. In these cases, the end layer 130 may be formed of an amorphous silicon material (e.g., a-Si) that facilitates bonding to the silicon oxide layer of the dielectric body 102. As another example, the dielectric body 102 may include silicon oxide, such as by being formed of a borosilicate glass. Here, the end layer 130 may also be formed of the amorphous silicon material. However, other materials are possible (e.g., boron oxide).

In certain cases, the end layer 130 that is formed of a material that is chemically inert to the vapor (e.g., chemically inert to a vapor of alkali metal atoms). in these cases, the end layer 130 may prevent the vapor from reacting with the first multilayer coating 126*a* (or layers therein) and thus alter the optical properties of the first multilayer coating 126*a*. Examples of the end layer 130 include an oxide layer (e.g., $Al_2O_3$, $ZrO_2$, etc.), a fluoride layer (e.g., MgF), an antirelaxation layer (e.g., a layer of paraffin, a layer of organosilane molecules, etc.). Other materials are possible. In some variations, the end layer 130 may be formed by passivating a top layer of the first multilayer coating 126*a*. For example, the top layer of the first multilayer coating 126*a* may be an amorphous silicon layer that has an exposed surface along the covering portion 128. The amorphous silicon layer may react with alkali metal atoms in the vapor, thereby producing an end layer that is formed of a silicon/alkali metal alloy (e.g., $Si_xM_y$ where M=an alkali metal). This alloy may be inert to further reaction and thus allow the end layer to passivate the exposed surface of the amorphous silicon layer.

Figure 2A:
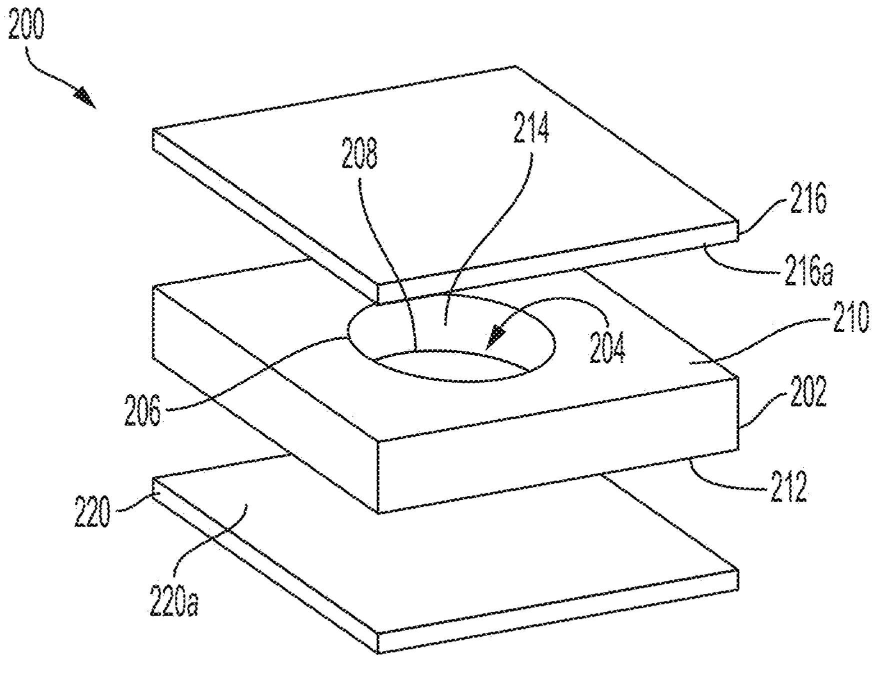
FIG. 2A is a schematic diagram, in exploded perspective view, of an example vapor cell having two optical windows.
Figure 2B:
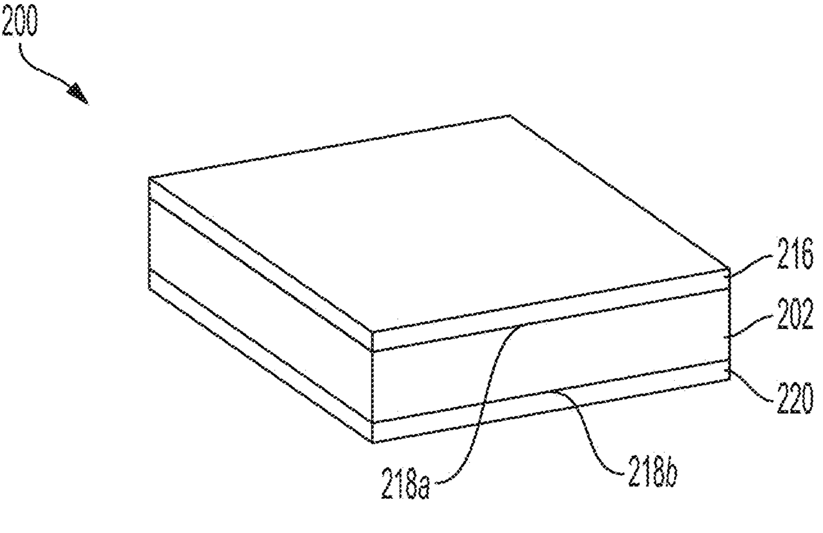
FIG. 2B is a schematic diagram, in perspective view, of the example vapor cell of FIG. 2A, but in which both optical windows are bonded to a dielectric body of the example vapor cell.

Although FIGS. 1A-1F depict the example vapor cell 100 as having a single optical window, two or more optical windows are possible for the example vapor cell 100. Moreover, in some variations, the cavity 110 may extend entirely through dielectric body 102. FIG. 2A presents a schematic diagram, in exploded perspective view, of an example vapor cell 200 having two optical windows 216, 220. The example vapor cell 200 may be analogous in many features to the example vapor cell 100 shown by FIGS. 1A-1F. FIG. 2B presents a schematic diagram, in perspective view, of the example vapor cell 200 of FIG. 2A, but in which both optical windows 216, 220 are bonded to a dielectric body 202 of the example vapor cell 200. The example vapor cell 200 includes the dielectric body 202 and a cavity 204 in the dielectric body 202. The cavity 204 extends completely through the dielectric body 202 from a first opening 206 to a second opening 208. A first exterior surface 210 of the dielectric body 202 defines the first opening 206 to the cavity 204, and a second exterior surface 212 of the dielectric body

202 defines the second opening 208 to the cavity 204. An interior surface 214 of the dielectric body 202 defines the cavity 204. A vapor or a source of the vapor (not shown) may reside in the cavity 204 of the dielectric body 202. However, in some instances, the cavity 204 includes a first chamber, a second chamber, and a channel that fluidly couples the first and second chambers. In these instances, the source of vapor is disposed in the second chamber of the cavity 204.

The two optical windows 216, 220 may be bonded to respective surfaces on different sides (e.g., opposite sides) of the dielectric body 202. For example, the example vapor cell 200 may include a first optical window 216 covering the first opening 206 of the cavity 204. The first optical window 216 has a first window surface 216*a* bonded to the first exterior surface 210 of the dielectric body 202 to form a first bonded interface 218*a* of the example vapor cell 200. The first bonded interface 218*a* includes a first seal around the first opening 206. The example vapor cell 200 additionally includes a second optical window 220 covering the second opening 208 of the cavity 204. The second optical window 220 has a first window surface 220*a* bonded to the second exterior surface 212 of the dielectric body 202 to form a second bonded interface 218*b* of the example vapor cell 200. The second bonded interface 218*b* includes a second seal around the second opening 208. In many implementations, the first and second optical windows 216, 220 each have respective first and second multilayer coatings that are analogous to those described in relation to the optical window 104 of FIGS. 1A-1F. However, the first and second multilayer coatings of the first optical window 216 may be different than those of the second optical window 220. Moreover, the first and second multilayer coatings need not be the same for an individual optical window.

The dielectric body 202 and the optical windows 216, 220 may share features in common with, respectively, the dielectric body 102 and the optical window 104 described in relation to the example vapor cell 100 of FIGS. 1A-1F. For example, the dielectric body 202 may be formed of silicon (Si), aluminum oxide (e.g., $Al_2O_3$), or a glass that includes silicon oxide (e.g., $SiO_2$, $SiO_x$, etc.). In another example, one or both of first and second optical windows 216, 220 may include respective substrates that are formed of a material transparent to laser light used to interact with the vapor sealed within the cavity 204 of the dielectric body 202. Other features and their combinations are possible. Similarly, the vapor and the source of the vapor may share features in common with, respectively, the vapor and the source of the vapor 114 described in relation to the example vapor cell 100 of FIGS. 1A-1F. For example, the vapor may include a gas of alkali metal atoms, a noble gas, a gas of diatomic halogen molecules, a gas of organic molecules, or some combination thereof. In another example, the source of the vapor may reside in the cavity 204 of the dielectric body 202 and may include a liquid or a solid source of alkali metal atoms that generates a vapor of the alkali-metal atoms when heated or irradiated. Other features and their combinations are possible.

In some implementations, such as shown in FIGS. 2A-2B, the first and second exterior surfaces 210, 212 of the dielectric body 202 are planar surfaces opposite each other, and the first window surfaces 216*a*, 220*a* of the first and second optical windows 216, 220 are planar surfaces. In some implementations, the second exterior surface 212 of the dielectric body 202 and the surface 222 of the second optical window 220 have an RMS surface roughness, $R_q$, no greater than a threshold surface roughness. In some variations, the threshold surface roughness is less than 50 nm. In some variations, the threshold surface roughness is less than 30 nm. In some variations, the threshold surface roughness is less than 10 nm. In some variations, the threshold surface roughness is less than 1 nm.

In some implementations, the second seal is formed after the first seal, thereby allowing the second optical window 220 to enclose the cavity 204. In certain cases, the second seal includes a metal oxynitride layer disposed along the second bonded interface 218*b* between the second exterior surface 212 of the dielectric body 202 and the first window surface 220*a* of the second optical window 220. In certain cases, the first seal may also include a metal oxynitride layer disposed along the first bonded interface 218*a* between the first exterior surface 210 of the dielectric body 202 and the first window surface 216*a* of the first optical window 216.

In some implementations, the first seal includes a bond between the first exterior surface 210 of the dielectric body 202 and the first window surface 216*a* of the first optical window 216. The bond may be formed using hybrid bonding processes that result in a metal oxynitride layer along the bonded interface 218*a*. In some implementations, the dielectric body 202 is formed of a glass that includes silicon oxide (e.g., $SiO_2$, $SiO_x$, etc.) and the first optical window 216 includes silicon oxide (e.g., $SiO_2$, $SiO_x$, etc.). In these implementations, the example vapor cell 200 includes a layer of silicon (e.g., amorphous silicon) disposed between the first exterior surface 210 of the dielectric body 202 and the first window surface 216*a* of the first optical window 216. The first seal includes a bond between the layer of silicon and one or both of the first exterior surface 210 of the dielectric body 202 and the first window surface 216*a* of the first optical window 216. The bond may be formed using hybrid bonding processes that result in a silicon oxynitride layer along the bonded interface 218*a*.

The first and second multilayer coatings described in relation to the optical window 104 of FIGS. 1A-1F and the optical windows 216, 220 of FIGS. 2A-2B may be configured to prevent deformation (e.g., warping, bowing, etc.) of their associated substrates, such as due to the application of excessive stresses. For example, the first and second multilayer coatings may be configured to apply, respectively, first and second stresses to their substrate. However, the second multilayer coating may be formed during deposition such that the second stress counteracts the first stress, thereby allowing the substrate to remain undeformed. As a result, the first and second window surfaces of the optical window may be better suited for bonding with the dielectric body. For example, the first window surface may retain a target surface shape that provides advantages during the manufacturing of a vapor cell. For example, the exterior surface of the dielectric body may be a planar exterior surface, and the first window surface may retain a planar shape that is well suited to match a planar exterior surface. In these cases, the hermeticity of the seal may be improved. The bonding strength along the bonded interface may also be improved. Other advantages are possible (e.g., improved transmission of laser light into the cavity).

In some implementations, one or both of the first and second multilayer coatings include a sequence of layers having respective layer stresses that alternate between tension and compression. In the sequence, adjacent tensile and compressive stresses counteract each other, producing a net stress for the sequence that is zero or near zero (e.g., less than 1 MPa in tension or compression). The influence of the net stress on the substrate may therefore be negligible, allowing the substrate to remain undeformed. Moreover, the associated optical window may then have first and second window surfaces that retain their respective target surface shapes (e.g., a planar surface shape).

In some implementations, the first and second stresses oppose each other and result in a net stress applied to the substrate of no greater than 100 MPa. This net stress may prevent deformation of the substrate and may also prevent delamination of the first and second multilayer coatings from the substrate. In some implementations, the net stress is no greater than 10 MPa. In some implementations, each layer in the first and second multilayer coatings has a layer stress of no greater than 10 MPa.

In some implementations, the first and second multilayer coatings include first and second types of layers to allow them to manipulate laser light (e.g., entering the cavity, exiting the cavity, etc.). For example, the alkali metal atoms may have a target optical transition when in a vapor state (e.g., a probe optical transition, a coupling optical transition, etc.). In these cases, the substrate is transparent to a laser wavelength that is matched to the target optical transition. Moreover, the first type of layer has a first index of refraction at the laser wavelength in a first range from 1.9 to 4.5, and the second type of layer has a second index of refraction at the laser wavelength in a second range from 1.2 to 1.9. As such, the first type of layer may correspond to a layer of "high" (H) refractive index and the second type of layer may correspond to a layer of "low" (L) refractive. The first and second types of layers may be selected in thickness, composition, number, and order to produce a target optical property for a multilayer coating, such as anti-reflective properties, reflective properties, filtering properties, and polarizing properties. The substrate may also be configured with an index of refraction to support the target optical property. For example, the substrate may have a substrate index of refraction at the laser wavelength in a substrate range from 1.3 to 1.6.

In some implementations, the first multilayer coating or the second multilayer coating may include an alternating sequence of first and second types of layers that starts with a first instance of the first type of layer. In these implementations, the first instance of the first type of layer may be disposed on the first substrate surface for the first multilayer coating and on the second substrate surface for the second multilayer coating. An example of an alternating sequence of first and second types of layers is described in relation to FIGS. 4-6B, which shows anti-reflective properties for the alternating sequence.

Additional types of layers are possible for the first and second multilayer coatings. For example, one or both of the first and second multilayer coatings may include a third type of layer that has a third index of refraction at the laser wavelength. The third index of refraction may have a magnitude between the first and second indices of refraction, and as such, the third type of layer may correspond to a layer of "medium" (M) refractive index. The third type of layer may allow gradual changes in refractive index between the first and second types of layers that improve aspects of the target optical property (e.g., a reduction in reflection of the laser wavelength). In some implementations, the first multilayer coating or the second multilayer coating may include a base instance of the third type of layer that is disposed on a substrate surface (e.g., the first substrate surface for the first multilayer coating, the second substrate surface for the second multilayer coating, etc.). In these implementations, the first multilayer coating or the second multilayer coating includes an alternating sequence of first and second types of layers that starts with a first instance of the first type of layer. Here, the first instance of the first type of layer disposed on the base instance of the third type of layer. Moreover, the base instance of the third type of layer may improve an optical transition between the substrate and the first instance of the first type of layer, thereby reducing a reflection of the laser wavelength at the optical transition.

The first and second multilayer coatings may also include repeating sequences of types of layers. For example, one or both of the first and second multilayer coatings may include a base instance of the third type of layer that is disposed on a substrate surface (e.g., the first substrate surface for the first multilayer coating, the second substrate surface for the second multilayer coating, etc.). One or both of the first and second multilayer coatings may then include a repeating sequence of layers in which each sequence is defined, in successive order, by one first type of layer, one third type of layer, and one second type of layer (e.g., a repeating sequence of unit "HML"). The repeating sequence of layers may repeat, for example, 1-5 times. Moreover, the repeating sequence of layers may have a first instance of the first type of layer that is formed on the base instance of the third type of layer. Other repeating sequences are possible.

In some implementations, the target optical transition may include multiple optical transitions, and the laser wavelength may include multiple corresponding laser wavelengths. For example, the target optical transition may include probe and coupling optical transitions of the alkali metal atoms when in the vapor state. In these cases, the laser wavelength comprises probe and coupling laser wavelengths that are matched to, respectively, the probe and coupling optical transitions. Examples of possible optical transitions for the alkali metal atoms are described in U.S. Pat. No. 12,306,237 entitled "Detecting Phase Properties of Radio Frequency Waves".

The example vapor cell 100 of FIGS. 1A-1F and the example vapor cell 200 of FIGS. 2A-2B may be manufactured using bonding processes for bonding an optical window to a dielectric body. The bonding processes may, for example, be used to bond the optical window 104 to the dielectric body 102 when manufacturing the example vapor cell 100 of FIGS. 1A-1F. The bonding processes may also be used to bond the first and second optical windows 216, 220 to the dielectric body 202 when manufacturing the example vapor cell 200 of FIGS. 2A-2B. In some cases, the first optical window 216 is bonded to the dielectric body 202 using an electric field assisted bonding process, and hybrid bonding processes are used to subsequently bond the second optical window 220 to the dielectric body 202. In many implementations, the hybrid bonding processes result in a metal oxynitride layer along the interface between the two bonded surfaces.

Figure 3:
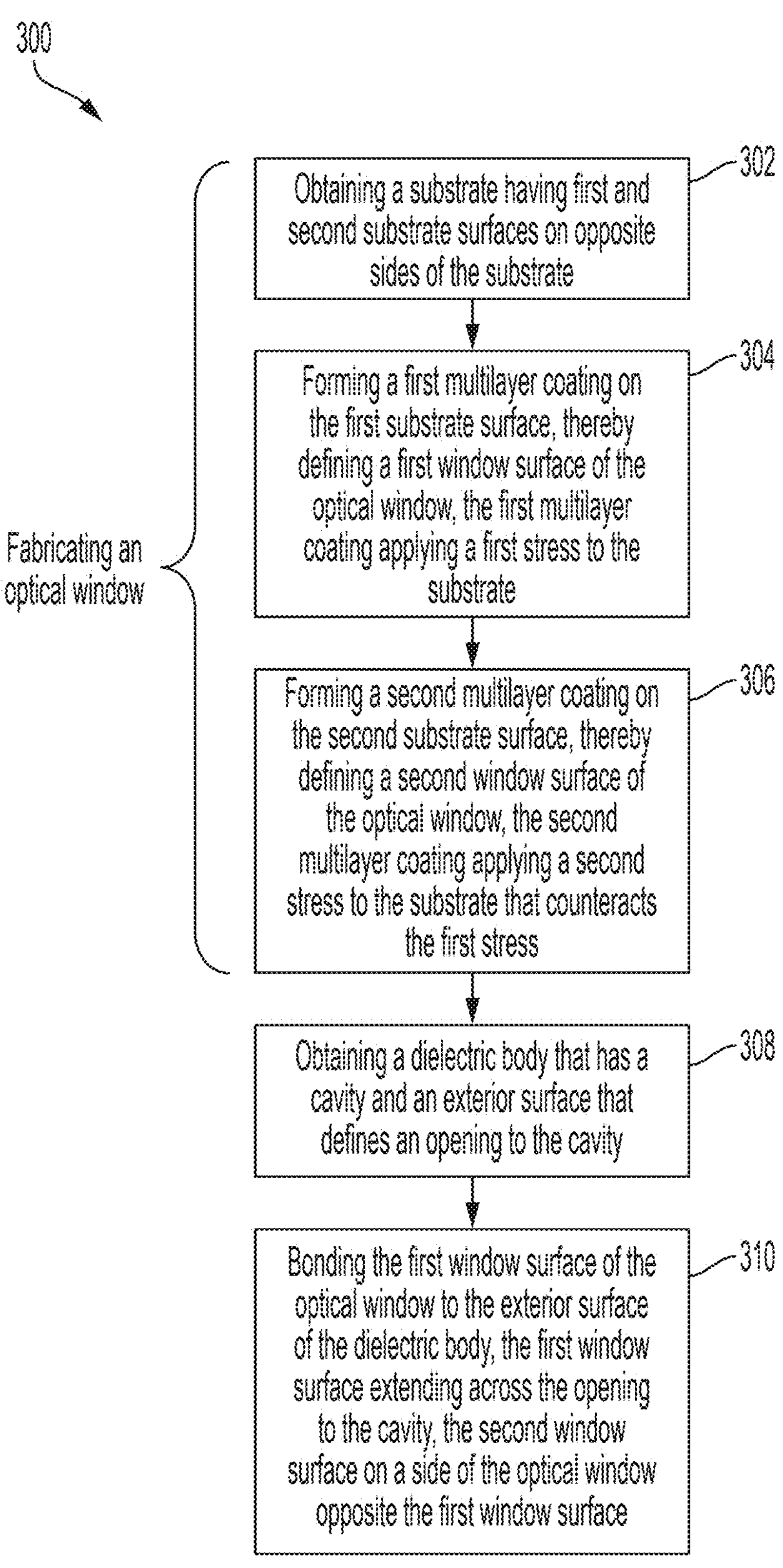
FIG. 3 is a flowchart of an example processes for bonding an optical window to a dielectric body of a vapor cell.

FIG. 3 presents a flowchart of an example 300 of the bonding processes for bonding an optical window to a dielectric body of a vapor cell. The example process 300 includes fabricating an optical window, such as the optical window 104 of FIGS. 1A-1F or the optical windows 216, 220 of FIGS. 2A-2B. Fabricating the optical window includes obtaining a substrate having first and second substrate surfaces on opposite sides of the substrate, such as shown in block 302. Fabricating the optical window also includes forming a first multilayer coating on the first substrate surface (block 304) and forming a second multilayer coating on the second substrate surface (block 306). The first multilayer coating defines a first window surface of the optical window and applies a first stress to the substrate. Similarly, the second multilayer coating defines a second window surface of the optical window and applies a second stress to the substrate. However, the second stress counteracts the first stress. The example process 300 also includes obtaining a dielectric body that has a cavity and an exterior surface that defines an opening to the cavity, as shown in block 308. The example process 300 additionally includes bonding the first window surface of the optical window to the exterior surface of the dielectric body, as shown in block 310. The first window surface extends across the opening to the cavity. Moreover, the second window surface resides on a side of the optical window opposite the first window surface. If the optical window is used to enclose the cavity—e.g., as a final optical window for the vapor cell—the second window surface may also face an exterior of the vapor cell.

In some implementations, forming the first and second multilayer coatings may include successively depositing layers of an individual multilayer coating on top of each other. Such deposition may be conducted using thin film deposition processes such as, for example, magnetron sputtering, evaporation, ion beam sputtering, plasma-enhanced vapor deposition, and atomic layer deposition. These deposition processes are described further below and may be adapted to produce layers having target thicknesses, compositions, stresses, refractive indices, and so forth.

In some implementations, forming the first and second multilayer coatings may include forming a desired arrangement of layers on top of each other. The desired arrangement may include certain types of layers, such as the first and second types of layers described in relation to FIGS. 1A-2B. For example, forming the first multilayer coating or forming the second multilayer coating may include alternately forming instances of the first and second types of layers on top of each other, thereby forming an alternating sequence of first and second types of layers that starts with a first instance of the first type of layer. In these cases, the first instance of the first type of layer is formed on a substrate surface (e.g., the first substrate surface for the first multilayer coating, the second substrate surface for the second multilayer coating, etc.).

The desired arrangement may also include a third type of layer. For example, one or both of forming the first multilayer coating or forming the second multilayer coating may include forming a base instance of the third type of layer on a substrate surface (e.g., the first substrate surface for the first multilayer coating, the second substrate surface for the second multilayer coating, etc.). In these cases, forming the first multilayer coating or forming the second multilayer coating may further include alternately forming instances of the first and second types of layers on top of each other, thereby forming an alternating sequence of first and second types of layers that starts with a first instance of the first type of layer. The first instance of the first layer is formed on the base instance of the third type of layer. Alternately, forming the first multilayer coating or forming the second multilayer coating may include successively forming, in order and on top of each other, one first type of layer, one third type of layer, and one second type of layer, thereby forming a repeating sequence of layers. Here, the repeating sequence of layers has a first instance of the first type of layer that is formed on the base instance of the third type of layer. Other types of arrangements are possible.

In some implementations, the example process 300 may include altering an exposed surface of the first multilayer coating to have a root mean square (RMS) surface roughness, $R_q$, no greater than a threshold roughness (e.g., 1 nm). The exposed surface may be defined by an end layer of the first multilayer coating, which may be a final layer of the first multilayer coating after the multilayer coating is fully formed or an intermediate layer of the first multilayer coating as the multilayer coating is being successively formed. Altering the exposed surface may include processes based on, for example, thermal control during deposition, plasma-assisted polishing, ion beam figuring, chemical mechanical polishing and so forth.

In some implementations, the optical window is a final optical window that is bonded to the dielectric body. For example, the cavity may be configured to extend only partially through the dielectric body. In these cases, the example process 300 includes disposing a vapor or a source of the vapor in the cavity. The vapor or the source of the vapor includes alkali metal atoms. Moreover, bonding the first window surface to the exterior surface of the dielectric body includes enclosing the cavity with the optical window.

In some implementations, the optical window may be bonded to the dielectric body before a final optical window. For example, the exterior surface of the dielectric body may be a first exterior surface, the opening may be a first opening, and the optical window may be a first optical window. In such cases, and as shown in the example vapor cell 200 of FIGS. 2A-2B, the dielectric body may include a second opening that is defined by a second exterior surface of the dielectric body. Here, the cavity extends completely through the dielectric body from the first opening to the second opening, and the first optical window is bonded to the dielectric body to cover the first opening. The example process 300 may then include disposing a vapor or a source of the vapor in the cavity. The vapor or the source of the vapor includes alkali metal atoms. The example process 300 also includes fabricating a second optical window with feature analogous to the first optical window (e.g., that includes a second substrate with third and fourth multilayer coatings disposed thereon). The second optical window is then bonded to the dielectric body cover the second opening, thereby enclosing the vapor or the source of the vapor therein. In this configuration, the second optical window is a final optical window.

In implementations where the source of the vapor is present, the example process 300 may include heating or irradiating the source of the vapor after the final optical window is bonded. Such heating or irradiation includes generating a vapor or gas of alkali metal atoms. In configurations where the second chamber is present, the source of the vapor may be disposed in the second chamber before the final optical window is bonded. The second chamber may serve as an alternative location to the first chamber for the source of the vapor. In such configurations, and after the seal is formed, the source of the vapor may be heated or irradiated, thereby allowing a vapor or gas of alkali metal atoms to flow through the channel and into the first chamber.

In a general aspect, the bonding processes for bonding an optical window to a dielectric body of a vapor cell includes forming multilayer coatings to one or more optical windows of a vapor cell, particularly on a MEMs-type vapor cell. Reflections from the optical windows can affect the laser sources used for the excitation of the vapor atoms and molecules inside the vapor cell. The reflections may also lead to a loss of signal. Moreover, optical windows that transmit unwanted colors of light can lead to photodetector background signals that yield an increase in noise. However, reflective surfaces can be used to recycle light. Filters can also be used to prevent unwanted light from being transmitted to the photodetector. Thus, optical coatings can provide advantages for applications that rely on atomic and/or molecular vapor cells, such as atomic clocks, Rydberg atom-based electric field sensors, and atomic magnetometers.

Increasing the transmission efficiency of optical signals through an internal cavity in a vapor cell is beneficial for Rydberg atom-based quantum sensors. To assist in propagating optical signals through the internal cavity, the top and bottom optical windows may include one or more optical coatings. Examples of such coatings include a reflective coating, an anti-reflective coating, a filter coating, a polarizing coating, and so forth. When fabricating a vapor cell for quantum sensor applications, mitigating reflections at multiple surfaces is particularly beneficial, especially in multi-transition optical configurations. For example, in the systems where multiple optical windows or surfaces are necessary, even small reflections can result in significant compound losses. This effect can be particularly problematic in multi-transition optical arrangements, where light passes through those interfaces, each introducing its own reflective losses. These reflective losses can compound, leading to a significant reduction in light intensity and, consequently, the overall efficiency and performance of the quantum sensor.

To mitigate optical losses, single or multilayer thin film coatings can be used to engineer an optical transmission through the vapor cell, whether in the form of a filter coating, antireflection coating, or a reflective coating. While single-layer coatings can be applied to reduce reflection to nearly zero at a specific wavelength, quantum sensors often operate across multiple wavelengths, necessitating more sophisticated solutions. Multilayer coatings can thus effectively minimize reflections over a broader wavelength range, accommodating various wavelengths encountered in these applications. Designing multilayer coatings may involve specific materials and stack engineering, which can be complex and time-consuming, especially for a MEMS-based vapor cell. It can also be challenging to find materials with the desired refractive index and absorption properties over a specific wavelength range that are mechanically compatible with materials of a vapor cell as well as allowing the vapor cell components to be bonded. While multilayer coatings are highly effective in enhancing optical performance, their implementation introduces additional complexities when the optical surface must also meet constraints for bonding to ensure hermiticity (e.g., low temperature hybrid bonding). Low temperature wafer bonding, often needed for integrating various components in optical systems, may impose specific requirements on the coating materials and thicknesses, thereby complicating the design and fabrication process of optical coatings. Thus, developing solutions that balance the properties of an optical coating with the functional demands of a hermetic bond remains a significant challenge, especially when applied to vapor cell design.

Utilizing antireflection coatings on the windows of a vapor cell can be difficult because it can be complicated and time consuming to coat the vapor cell after it has been fabricated. It may also be difficult to coat the inside surfaces once the vapor cell has been sealed. Placing layers of materials to form optical coatings can also induce stress in the body of the vapor cell unless the lattice mismatch between the materials is accommodated or mitigated. The stress induced can affect the surface roughness of the windows, and in certain cases, prevent their bonding, even if forgiving techniques like electric field assisted bonding are used. It is also advantageous to use chemically inert materials for the coatings, especially when working with highly reactive species like alkali atoms and their vapors.

To reduce the surface stress, both sides of an optical window may be coated. However, coating both sides of the window usually produces surfaces that are difficult to bond to the frame (e.g., a dielectric body), such as a silicon frame or a glass frame. In cases where both sides of the optical window are coated with an optical coating—such as to engineer the light transmission—an adhesion layer can be used to facilitate a hermetic bond and thus allow the fabrication of a vapor cell. In some implementations, the bonding processes include depositing a desired optical coating on each side of an optical window of a vapor cell, thereby balancing the stress induced by the coatings on each side of the optical window. The resulting stress distribution may keep the optical window flat. In some implementations, the bonding processes also include coating an exposed surface of the vapor cell with an ultra-thin layer of amorphous silicon (a-Si) that can function as an adhesion layer. The adhesion layer may allow for the formation of a hermetic seal when the optical window is bonded to the internal surface. For example, the hermetic seal may surround the window by forming along its perimeter.

In some implementations, the bonding processes include applying a series of layers to a substrate to alter its optical characteristics, such as to enhance and control its optical transmission characteristics. The substrate may serve as part of an optical window of a vapor cell, such as a MEMs-type vapor cell. The optical window with multilayer coatings can be bonded to another surface through various methods, be it at the top or bottom of a device stack. The optical window can also be integrated as a component within an extended optical system that includes multiple substrates.

In some implementations, the bonding processes include selecting the material of a thin film layer to optimize the performance of a multilayer coating. The thin film layer may be part of a stack of layers, and the stack of layers may be designed to achieve desired antireflection characteristics (e.g., in the wavelength range of 500-540 nm and 800-900 nm). For example, the individual layers in the stack of layers can be designed with simulation software and optimized through a series of recipe adjustments that are determined by testing. Deposition techniques may also be optimized to ensure the uniformity and precision of the thin film layers, while controlling their residual film stress and surface roughness. Controlling these factors may allow the resulting antireflection coating to achieve an optimal optical performance, durability, and longevity. As such, the methods can provide superior properties for optical coatings in a wide range of optical applications, particularly the manufacture of MEM's-type vapor cells. The methods are also advantageous for vapor cells where the coated substrates can serve as windows for sealing the vapor cell as well as windows that can transmit light through the vapor cell in an engineered way.

In some implementations, the vapor cell includes an antireflective film stack. The antireflective film stack may include a substrate and one or more layers formed of respective materials. The respective materials may have refractive indices that are sufficiently different from one another to cause a step-change in refractive index. Such a step change may induce reflection at the interface. In some instances, the substrate which is referred to as "S" herein—may be formed of a material of low refractive index. For example, the "S" material may have a refractive index between 1.3 and 1.6. The "S" material may also have a coefficient of thermal expansion that is close to that of the other materials used. In some variations, the "S" material is a borosilicate glass. However, other substrate materials are possible, including LiF, fused silica, germanium, sapphire, or a chalcogenide-type glass.

In some implementations, the one or more layers may include a first type of layer formed of a material of high refractive index. This material-referred to as "H" herein—may have a refractive index that is substantially higher than that of the substrate. For example, the "H" material may have a refractive index between 1.9 and 4.5. Examples of the "H" material include titanium dioxide ($TiO_2$), titanium nitride (TiN), tantalum pentoxide ($Ta_2O_5$), tantalum nitride (TaN), yttrium oxide ($Y_2O_3$), niobium oxide ($Nb_2O_5$), and niobium nitride (NbN). However, other "H" materials are possible.

In some implementations, the one or more layers may include a second type of layer formed of a material of low refractive index. This material—referred to as "L" herein—may have a refractive index that is significantly lower than that of the "H" material. The refractive index of the "L" material may range between 1.2 and 1.9, and it may or may not be lower than the refractive index of the substrate. Examples of the "L" material include magnesium fluoride (MgF), silicon oxide (e.g., $SiO_2$, $SiO_x$), and silicon nitride ($Si_xN_y$). However, other "L" materials are possible.

Figure 5:
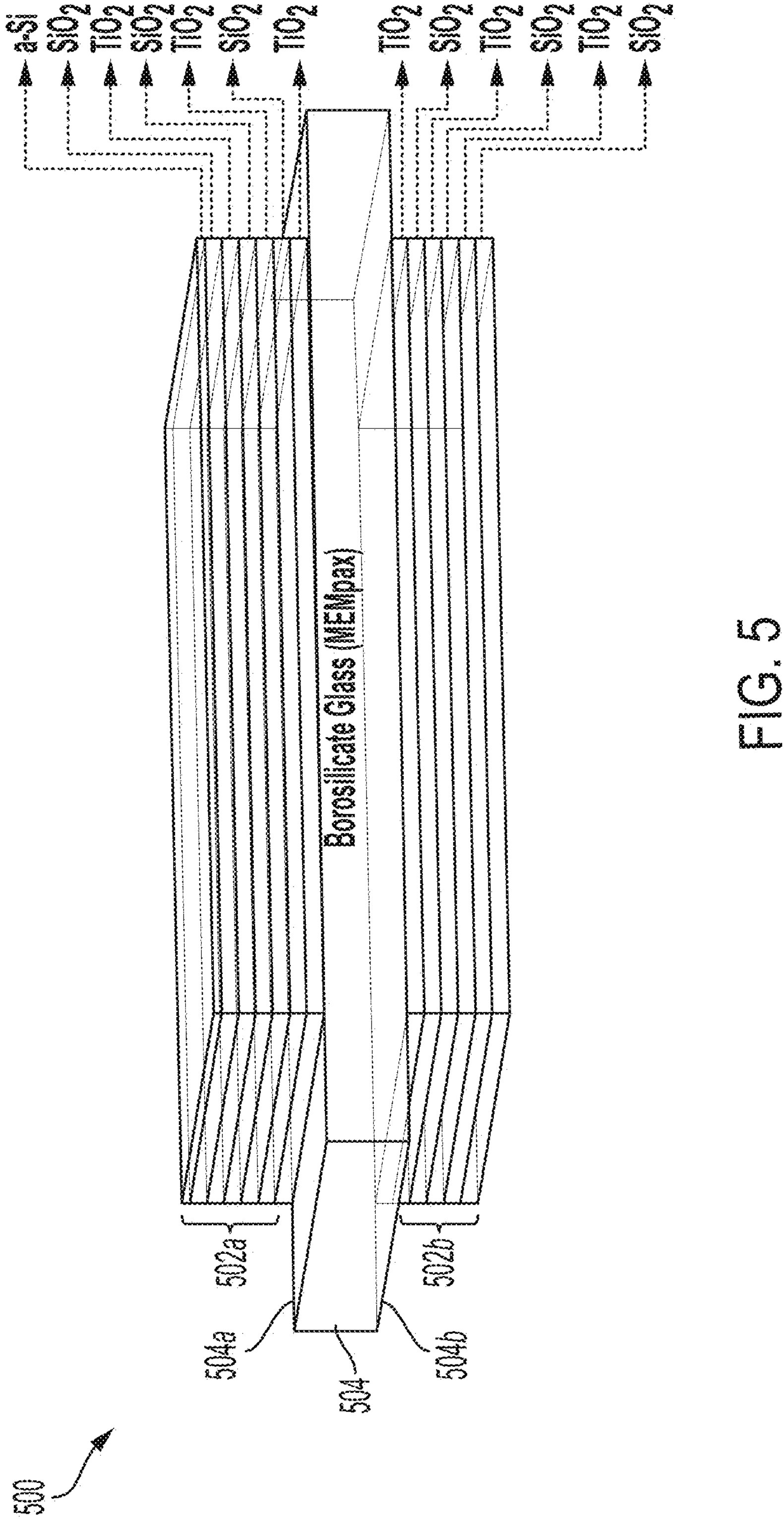
FIG. 5 is a schematic diagram, in elevation view, of an example optical window having first and second sets of integrated antireflection layers.

FIG. 5 presents a schematic diagram, in elevation view, of an example optical window 500 having first and second sets of integrated antireflection layers 502_a_, 502_b_. The first set of integrated antireflection layers 502_a_ is disposed on the top surface 504_a_ of a borosilicate glass substrate 504, and the second set of integrated antireflection layers 502_b_ is disposed on the bottom surface 504_b_ of the borosilicate glass substrate 504. Each set of layers 502_a_, 502_b_ includes an alternating sequence of titanium oxide ($TiO_2$) and silicon oxide ($SiO_2$) layers that correspond to, respectively, first and second types of layers. The titanium and silicon oxide correspond to, respectively, "H" and "L" materials. Moreover, the example optical window 500 includes an amorphous silicon layer (a-Si) that serves as an end layer for the first set of integrated antireflection layers 502_a_. The amorphous silicon layer (a-Si) may improve a bonding of the example optical window 500 to a frame for a vapor cell, such as a silicon wafer frame.

In some implementations, the one or more layers may include a third type of layer formed of a material of medium refractive index. This material—referred to as "M" herein—may have an index of refraction that falls between the "L" and "H" materials. The specific index of refraction for the "M" material may be chosen based on refractive indices of the "L" and "H" materials. Examples of the "M" material include alumina ($Al_2O_3$), aluminum nitride (AlN), and zirconia ($ZrO_2$). Additionally, fractional blends of high index (H) and low index (L) materials in an individual layer may be used as substitutes for the "M" material. In many cases, the "H", "L", and "M" materials are dielectric or insulating in nature. Pure metals are typically unsuitable for Rydberg atom-based sensors as they can interfere with the radiofrequency (RF) signals used in the end device. However, metallic materials may be suitable in certain applications like optical clocks and magnetometers. For magnetometers, non-magnetic materials are used.

The stack of layers may be designed to achieve the desired optical coating characteristics. By employing thin film interference principles, a multilayer stack can be designed that minimizes reflection across a target wavelength range. In some instances, the substrate is configured as a thin sheet with a thickness between 100 μm and 1.5 mm. The stack of layers on one side of the substrate may then made up of, for example, between two and ten layers. These layers may be formed of high, medium, and low refractive index material, as described above. Moreover, in some instances, the opposing face (e.g., rear side) of the substrate may be coated with between two and ten layers of high, medium, and low refractive index material.

In some configurations, the structure of a stack of layers may have the form SHLHLHLHLHL, which can be represented by the compact notation of $S(HL)^nA$. In this notation, n corresponds to the number of "HL" pairs, and A corresponds to air or some other medium (e.g., a vacuum, a vapor of alkali metal atoms, etc.). In some instances, n may be a number between 1 and 5. In some configurations, the structure may have the form $A(LH)^nS(HL)^nA$. In yet another configuration, the structure may have the form $A(LH)^nMSM(HL)^nA$. Here, n may be a number between 1 and 4. In still yet another configuration, the structure may have the form $A(LMH)^nMSM(HML)^nA$. For this latter configuration, n may be a number between 1 and 3. Other configurations are possible for the structure of the stack of layers.

In some implementations, a layer stack design may omit one or more of the M, H, or L layers, or substitute one material for another, e.g., a layer stack may be of the form ALH(LL)HLHSMHLH(LL)HLA. In some implementations, the stack of layers may or may not be identical on both sides of the substrate, e.g., one side of the substrate may have some or none of the same layers as an opposing side. In some implementations, the physical thickness of each low index (L) layer, when present, will be between 3 and 250 nm. In some implementations, the physical thickness of each high index (H) layer, when present, will be between 10 and 300 nm. In some implementations, the physical thickness of each medium index (M) layer, when present, will be between 0 and 200 nm. FIG. 4 presents a table 400 showing examples of thicknesses for multilayer films that are stacked on both sides of a glass substrate. The "H" and "L" materials in the table 400 correspond to, respectively, titanium dioxide ($TiO_2$) and silicon oxide ($SiO_2$).

Figure 6A:
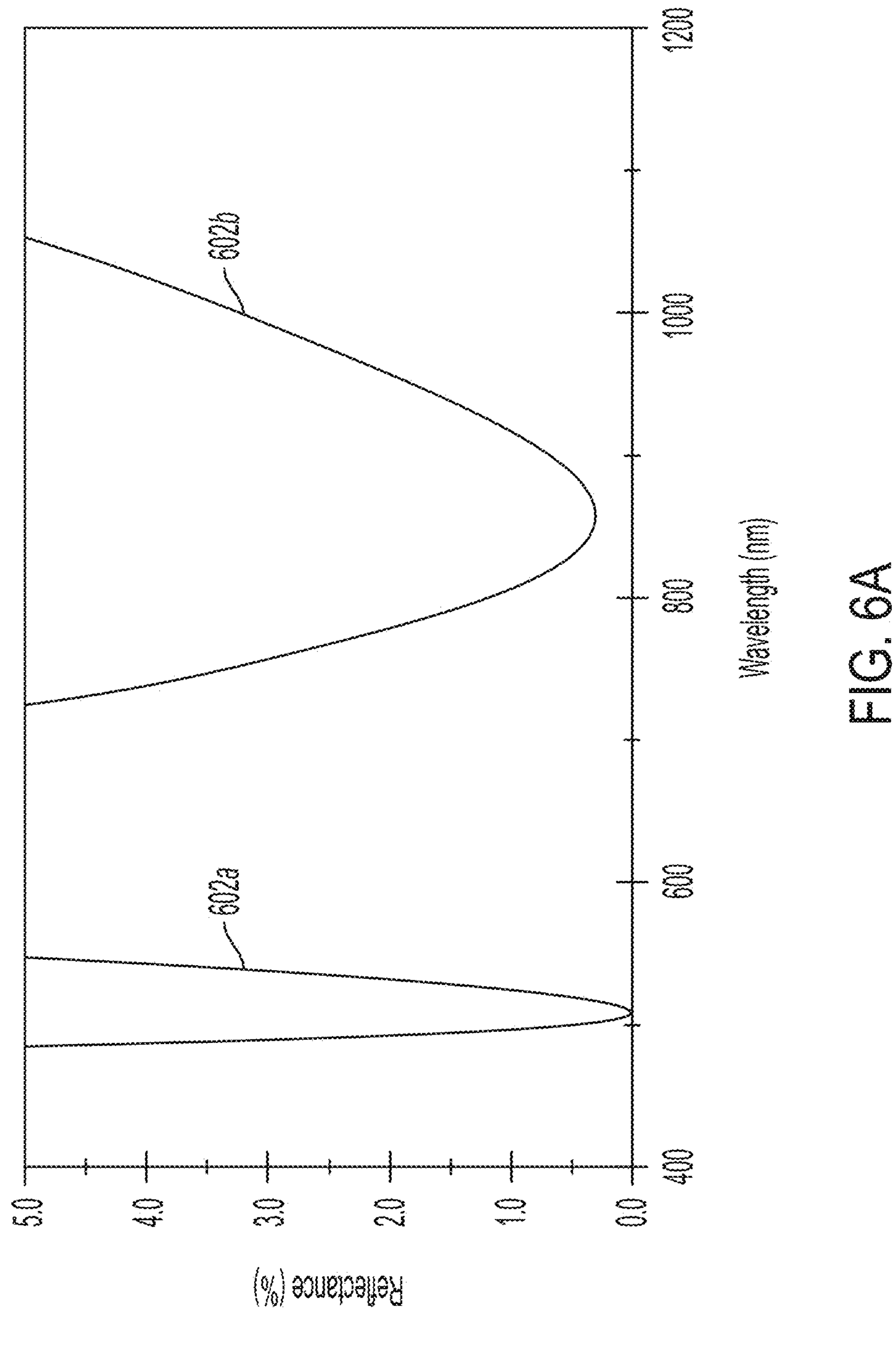
FIG. 6A is a graph showing, in simulation, an example spectrum for an antireflection coating that, when centered at 509 nm, has a wavelength range from 500-540 nm, and when centered at 852 nm, has a wavelength range from 800-900 nm.
Figure 6B:
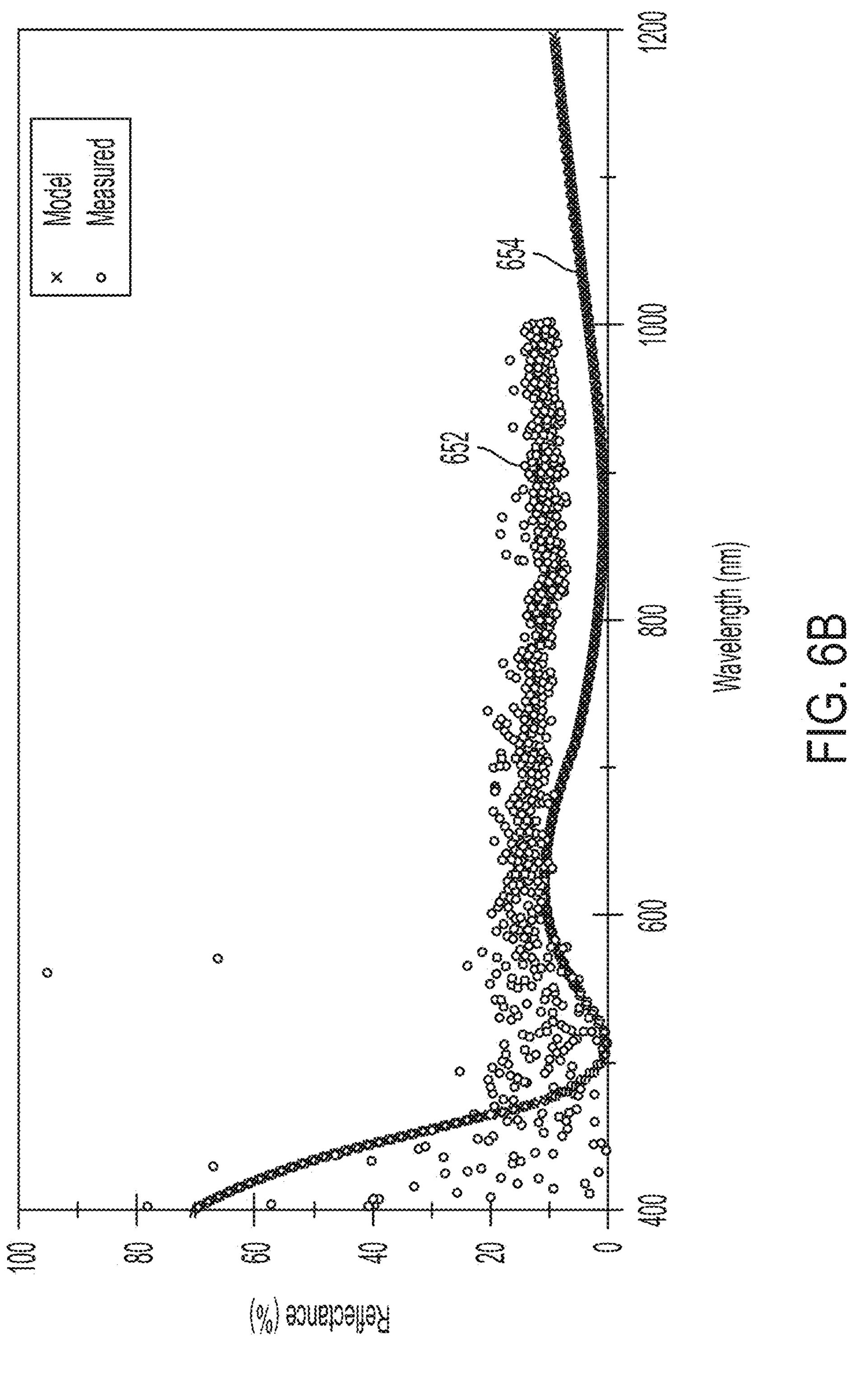
FIG. 6B is a graph showing an example of a reflectance spectra that is measured for a deposited antireflection coating.

In some implementations, the vapor cell includes an antireflection coated substrate. For the antireflection coated substrate, the finished optical component may result in a maximum reflectance (e.g., at an incident angle of 0°) of between 0 to 2% at some point in a target wavelength range, such as from 500 to 540 nm. The finished optical component may also result in a maximum reflectance (e.g., at an incident angle of 0°) of between 0 to 2% at some point in a target wavelength range from 800 nm to 900 nm. These coatings may, for example, be designed for a Rydberg atom-based sensor that includes a vapor of cesium atoms. FIG. 6A presents a graph 600 showing, in simulation, an example spectrum 602 for an antireflection coating that, when centered at 509 nm (see 602_a_), has a wavelength range from 500-540 nm, and when centered at 852 nm (see 602_b_), has a wavelength range from 800-900 nm. FIG. 6B presents a graph 650 showing an example of a reflectance spectra 652 that is measured for a deposited antireflection coating. For reference, FIG. 6B also shows a reference spectra 654 that has been simulated using an optical model.

Controlling residual film stress may help to ensure the mechanical integrity and optical performance of the optical coatings. During a deposition process, the thin film layers may undergo stress due to, for example, differences in thermal expansion coefficients or intrinsic stresses within the material. In certain cases, these differences are caused by the lattice mismatch between the different surfaces. Excessive stress can lead to film cracking, delamination, or changes in the optical properties of the thin film layers. The substrate may also bow, making it difficult (if not impossible) to bond to another material. These issues can be mitigated by controlling deposition parameters, such as temperature, pressure, and deposition rate. The final stress of an optical structure that includes the substrate and all applied layers may, in many instances, be less than 100 MPa. The stresses of films can be measured using optical characterization methods (e.g., the wafer-bow technique and its approximations).

In some implementations, the reduction in stress involves depositing alternating layers of thin film material in which one layer has compressive stress and the other layer has tensile stress. The internal stress characteristics of the layers are of the same order of magnitude but opposite in sign. In some implementations, the internal stress characteristics of each layer in the stack is zero or near-zero (e.g., less than 10 MPa in tension or compression). In some implementations, the total internal stress characteristics of the stack of layers may be balanced by a similar total internal stress present in a second stack of layers applied to the opposite substrate face. Stress of the applied multilayer coating can induce substrate deformation. For the glass substrates, such deformation can be prevented if the total stress is, for example, less than 10 MPa. In certain cases, the stress of any individual layer is less than 100 MPa to prevent film delamination (e.g., spalling).

Figure 7:
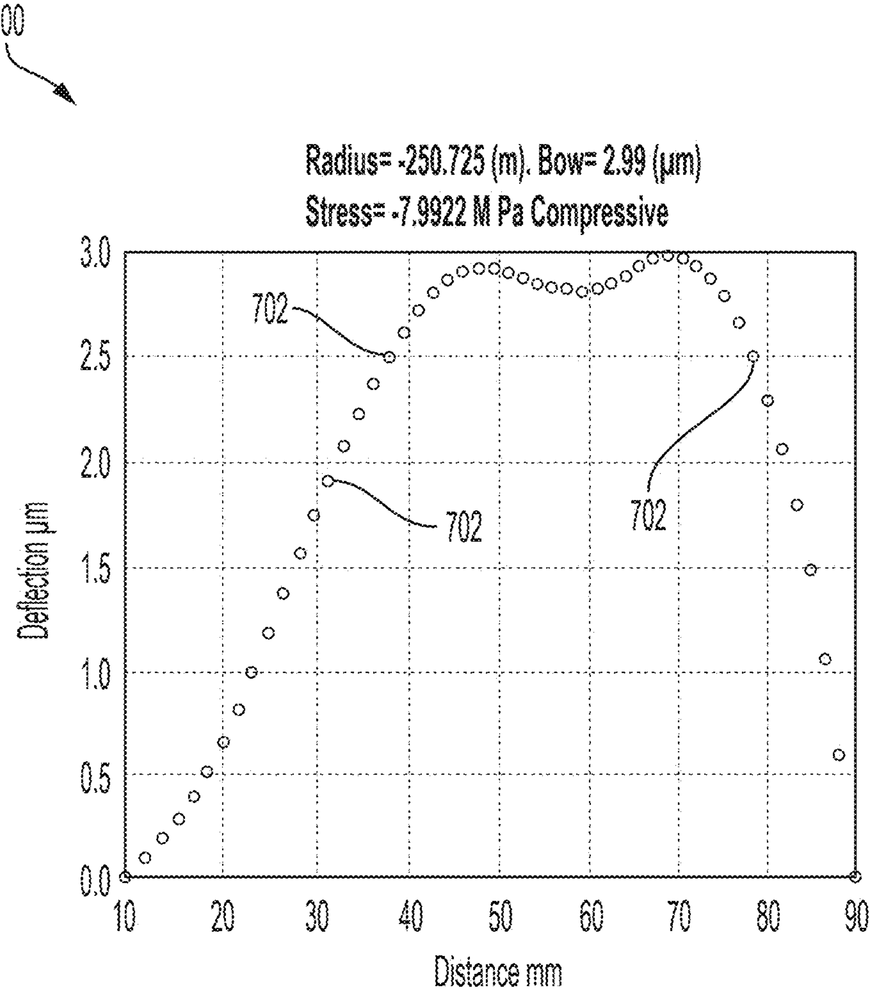
FIG. 7 is a graph of a deflection measurement for an example optical window having first and second multilayer coatings on opposite sides of a borosilicate glass substrate.

FIG. 7 presents a graph 700 of a deflection measurement for an example optical window having first and second multilayer coatings on opposite sides of a borosilicate glass substrate. The first and second multilayer coatings are each configured as antireflective coatings, and the borosilicate glass substrate is 0.5 mm thick and has a circular diameter of 100 mm. The deflection measurement is relative to a center reference point on a surface of the example optical window, and as such, the graph 700 includes data points 702 that represent a deflection of the example optical window at select distances from the reference point. As shown at the top of the graph 700, the example optical window exhibits a measured bow of 2.99 μm and a residual multilayer coating stress of about 8 MPa in compression. The estimated peak-to-valley (PV) warp is about 0.20 μm for the 100-mm borosilicate glass substrate. This estimate is determined using a theoretical Stoney-type estimation for a multilayer coating that has layer thicknesses as shown in table 400 of FIG. 4. The estimate also presumes a stress of less than 10 MPa for each of the first and second multilayer coatings. In contrast, the manufacturer of the borosilicate glass substrate (i.e., Schott) indicates that the borosilicate glass substrate has an inherent warp of less than 250 μm when manufactured. As such, the measured (2.99 μm) and estimated (0.20 μm) deflections are significantly less than the warp of the uncoated borosilicate glass substrate. The applied stresses of first and second multilayer coatings thus contribute negligibly to the bowing of the borosilicate glass substrate, and the example optical window can be considered effectively flat for bonding. Moreover, the measured (2.99 μm) and estimated (0.20 μm) deflections show that the counteracting stresses of the first and second multilayer coatings can improve the flatness of the borosilicate glass substrate relative to its as-manufactured state.

Surface roughness may also play a role in the optical performance and ability to bond. To achieve high-quality multilayer coatings, the surface roughness can be minimized during the deposition process. For example, the surface roughness of the applied layers may be no greater than 1 nm in a final configuration to allow usage in during bonding processes. In some situations, even nanoscale surface roughness can significantly increase the scattering of incident light, reducing the overall desired transmission/reflection effects. Conventional optical coatings typically have a surface roughness of above λ/20, where λ represents the wavelength of light (e.g., laser light) intended to interact with the optical coating. In many implementations, the multilayer optical coatings disclosed herein have a surface roughness of no greater than λ/500. For example, the multilayer optical coatings may be treated according to a surface modification process to have a surface roughness of no greater than λ/800. In certain cases, the surface roughness is no greater than λ/1000.

In some implementations, the surface roughness is modified mid-process or post-process using one or more techniques. For example, surface roughness control may be achieved by energy addition to the surface in the form of gas bombardment via plasma discharge. This bombardment could include an RF or DC discharge generated by suitably arranged ion beam sources or RF anode/cathode configurations. Examples of noble gases used to generate the plasma discharge include He, Ar, Kr, and Xe. Blends of such gases are possible. In some instances, blends of noble gases may be utilized with diatomic gases such as oxygen, nitrogen, or hydrogen.

In some implementations, the reduction in surface roughness is done continuously in time or at specified times, such as between layer applications. In some implementations, surface roughness control is achieved by energy addition to the surface in the form of thermal energy, reducing the sticking coefficient, S, of an incident material flux, thereby allowing greater surface mobility of adatoms. Temperature control of the substrate and film surfaces may, for example, be maintained between −70° C. and 900° C. In some instances, the temperature control may be maintained between 200-500° C. In some implementations, a plasma bombardment may be conducted after all layers have been deposited using a high uniformity gridded remote ion source (RF or DC type). In these implementations, the source is not connected to the substrate, and a combination of noble and reactive gases is introduced to the working environment to planarize the surface roughness below 1 nm. The planarization may be conducted before or after the application of a protective/sacrificial "planarization layer", which may be made of one of the layer materials. This surface modification process can, in certain cases, correspond to "ion milling", "ion figuring", or "ion beam planarization" and is used to reduce surface roughness below 1 nm.

In some implementations, the methods include a hybrid plasma-activated bonding process (e.g., a hybrid bonding process) that achieves void-free and strong bonds. The process may combine, for example, an oxygen and nitrogen plasma surface treatment that is followed by contact bonding at room temperature. The process may then be completed using an electric field assisted bonding transport at low temperatures no greater than 250° C. As a result, the bonded interface includes a metal oxynitride layer along its bonded area. The hybrid plasma-activated bonding process may be used, for example, to form a glass/AR/a-Si//$SiO_2$/Si structure. In this structure, the "glass" may correspond to a glass wafer (e.g., a borosilicate wafer), and the "Si" may correspond to a silicon wafer. However, other types of materials, bodies, and bonded arrangements are possible.

In some variations, the hybrid plasma activated wafer bonding process can use a commercially available silicon wafer having a p-type Si:B<100> orientation, a high resistivity, and a double side polish. The silicon wafer may, for example, have a diameter of 4 inches and be 1.5 mm thick with a surface roughness (RMS) no greater than 0.3 nm. The p-type wafer may have a higher rate of formation of intimate contact with a glass wafer than that of an n-type Si wafer.

The hybrid plasma activated wafer bonding process can also use a double side polished borosilicate glass wafer, such as can be obtained from Schott. The glass wafer may, for example, be a MEMpax wafer having a diameter of 4 inches and a thickness of 500 μm. The surface roughness may be less than 0.5 nm. In certain cases, the composition of the borosilicate glass includes $SiO_2$ (81%), $B_2O_3$ (13%), $Na_2O$/$K_2O$ (4%), and $Al_2O_3$ (2%). The glass wafer may have a high ion mobility and may match the coefficient of thermal expansion of silicon closely. As part of the process, the silicon and glass wafers are visually inspected for defects before use (e.g., chips, micro-cracks, and scratches).

Modification of the admittance, reflectance, or transmittance of the substrate surface can be accomplished by coating the substrate with a plurality of thin film layers applied using vacuum deposition techniques. Examples of these techniques include magnetron sputtering, evaporation or ion beam sputtering techniques, plasma enhanced vapor deposition methods, and atomic layer deposition methods. In certain cases, the thin film layers for the optical coatings are produced by magnetron sputtering of the high and low index materials using a RF or DC magnetron sputtering technique. Sputtering targets made of the high, medium, and low index materials or components of the materials are placed on magnetrons installed opposite the substrate. The targets are then bombarded with a plasma discharge that includes a noble gas or ionized diatomic gas or a mixture of a noble gas and ionized diatomic reactive gas (e.g., "reactive magnetron sputtering"). Gases are introduced to the working environment by a gas delivery orifice or by an ionization source. The gases may also be ionized via microwave, RF, or cathode type generators. For the thin film layers, the gases can be ionized using RF generator methods. Noble gases such as argon (Ar), krypton (Kr), or xenon (Xe), as well as diatomic reactive gases like $O_2$ and $N_2$, are employed. One example mixture of such gases includes $Ar:O_2$ at a ratio of 1:1 or up to 20:1. Such mixtures of noble and reactive gases can create thin film layers of oxide or nitride materials of high elemental purity. Examples of such materials include SiN, $SiO_2$, $TiO_2$, TiN, $Nb_2O_5$, $Al_2O_3$ and NbN. Other oxide and nitride materials are possible. The stoichiometry of reactively deposited materials may be adjusted using gas ratios to modify the refractive index of the final thin film layers. In certain cases, the working pressures in the environment are between 2 mTorr and 40 mTorr (i.e., 0.267 Pa and 5.33 Pa).

In some implementations, the thin film layers can be produced using evaporation processes with resistive or electron beam sources positioned opposite the substrate, containing high, medium, and low index materials or their elemental constituents. Noble gases such as Ar, Kr, or Xe, along with diatomic reactive gases like $O_2$ and $N_2$, may be used. Working pressures typically range from $10^{-6}$ Torr to 30 mTorr (i.e., 0.133 Pa to 4.00 Pa). Gases can be introduced into the working environment through a gas delivery orifice or via ionization sources such as gridded or end hall type RF or DC Ion Sources. Additionally, gases can be ionized using microwave, RF, or cathode type generators. Alternatively, thin film layers can be produced using ion beam sputtering methods, where noble gas ions generated in RF or DC ion sources are directed at targets placed opposite the substrate. These targets contain the high, medium, and low index materials or their elemental constituents. Noble gases like Ar, Kr, or Xe, and diatomic reactive gases such as $O_2$ and $N_2$ may be utilized. Working pressures may range from 2 mTorr to 300 mTorr (i.e., 0.267 Pa to 40.0 Pa), and the gases can be introduced into the working environment through a gas delivery orifice or via one or more ionization sources, including gridded or end hall type RF or DC Ion Sources. The gases can also be ionized using microwave, RF, or cathode type generators.

In some implementations, the substrate and coating equipment are installed into a vacuum chamber that includes the material deposition source, and a substrate holder mounted in opposition to the deposition source in either perpendicular (normal) orientation or at some azimuthal angle and rotational angle about the chamber axis. The vacuum chamber may be equipped with gauges, sensors, or other monitoring equipment for temperature, pressure, flux, and optical measurements. During operation, evacuation of the chamber is facilitated by pumping sources such as a turbomolecular pump system. Gas pressure within the chamber can be precisely controlled using pump flow metering devices and gas delivery metering devices, including mass flow controllers and mass flow meters, which can be arranged in closed or open loop control configurations. The vacuum chamber may also include heating or cooling elements to modify the temperature at the surface of the substrate or other areas of the working environment. The substrate and deposition sources may be fixed or rotatable. Substrate or target rotation may occur between 0-200 rpm. Temperatures may be controlled between −70° C. up to +900° C. in certain areas of the working environment and may be variable or held constant during processing.

In some implementations, the deposition process includes maintaining substrate temperatures between 10° C. and 500° C. to control thin film crystal structure and surface roughness by regulating the energy of the incident flux of adatoms. In certain cases, the process may employ substrate rotation between 10 and 100 RPM to achieve film thickness uniformity below 2% total thickness variation. Plasma bombardment can be carried out at intermediate steps or continuously during processing using a bias generator connected to the substrate and a combination of noble and reactive gases introduced into the working environment. Alternatively, plasma bombardment can be conducted using a remote ion source (e.g., a Hall effect or gridded source) that is not connected to the substrate, along with a combination of noble and reactive gases introduced into the working environment. In some instances, the temperatures are maintained at 400° C. to promote the proper growth and density of the film structure, ensuring the desired refractive index. Additionally, an $Ar:O_2$ blend generated by RF may be utilized to bombard the surface between each material layer for a specific duration. This process can minimize the surface roughness of the previously applied layer to less than 1 nm.

In some implementations, the vapor cell may include a frame that is defined by a silicon wafer. The silicon wafer may be processed to include a thermally grown layer of silicon oxide ($SiO_2$). Prior to the $SiO_2$ thermal oxide growth, the silicon wafer may be wet cleaned using solvents. The process flow of the wafer cleaning procedure includes ultrasonication using acetone, methanol, isopropanol (IPA), and deionized water (DI water) followed by drying with a nitrogen ($N_2$) flush. Then, in order to remove the particles, organic residues and other contaminants, the silicon wafers may be cleaned and hydrophilized in a first RCA (Standard Clean-I) solution (e.g., 5:1:1 mixture of $H_2O:NH_4OH:H_2O_2$) and a second RCA (Standard Clean-II) solution (e.g., 5:1:1 mixture of $H_2O:HCl:H_2O_2$) at temperature of 75-80° C. for 15 min, followed by a deionized water rinse and dried with pure nitrogen gas ($N_2$) in a cleanroom environment. High quality 50-nm silicon dioxide ($SiO_2$) layers of low stress and low roughness can then be grown on both sides of the silicon wafer by dry thermal oxidation technique. Dry oxidation can produce a higher-quality oxide layer compared to wet oxidation. Moreover, in certain cases, dry oxidation allows for better control over the oxidation process, including the thickness and uniformity of the oxide layer. The thermal oxide film is a silicon dioxide film produced by the oxidation of substrate silicon, at temperature around 1100° C.

Figure 8:
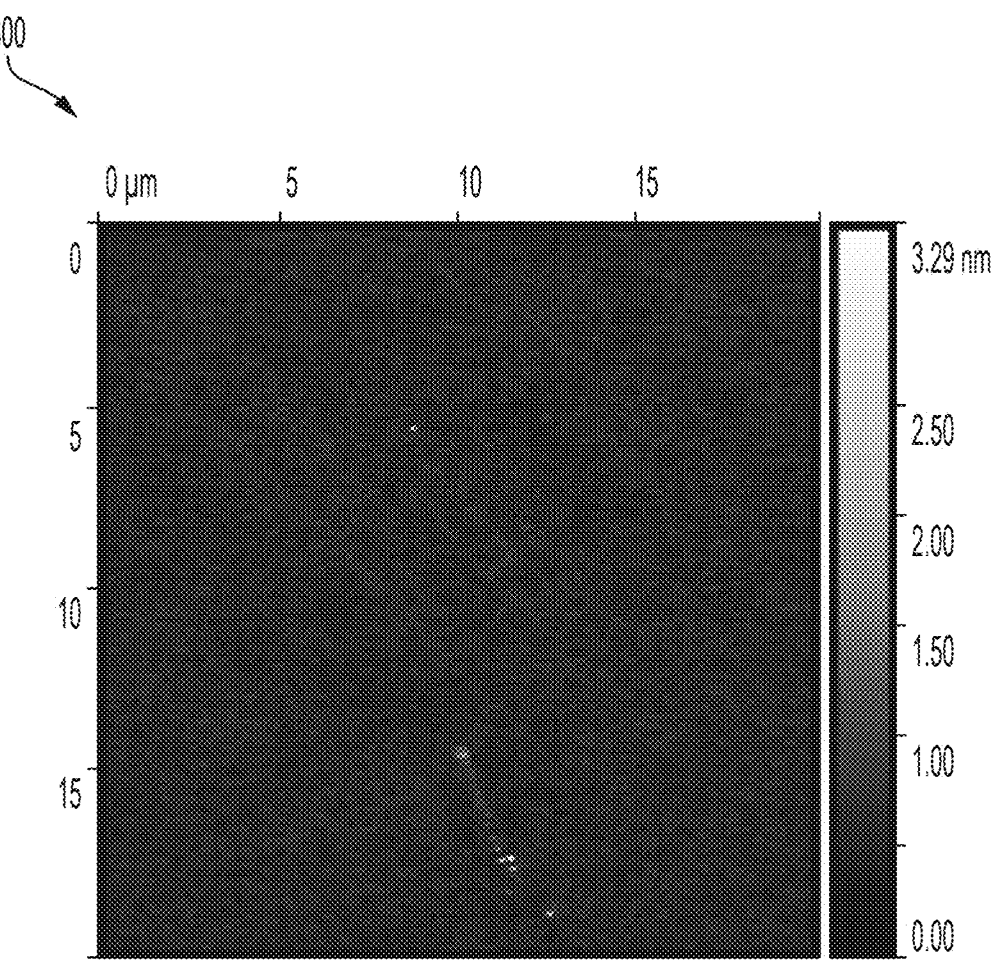
FIG. 8 is a scanning electron micrograph of an example surface morphology of a 20×20 $\mu m^2$ area of a 50-nm thick layer of $SiO_2$ grown using a "dry" thermal oxidation process.

The "dry" oxidation process may be represented by the reaction, $Si+O_2 \rightarrow SiO_2$. In some implementations, the silicon dioxide layer on the silicon wafer may be formed as oxygen atoms penetrate the silicon surface, oxidizing it and creating a layer of $SiO_2$. The oxide layer is uniform and has fewer defects than a wet oxidization process. Additionally, the dry oxidation process results in a denser oxide layer compared to wet oxidation, making it particularly suitable for atom-based sensing applications that require precise control over oxide thickness during the vapor cell manufacturing. FIG. 8 presents a scanning electron micrograph 800 of an example surface morphology of a 20×20 $\mu m^2$ area of a 50-nm thick layer of $SiO_2$ grown using a "dry" thermal oxidation process. The surface roughness of the as-grown $SiO_2$ film was found to be 0.15 nm. An RMS roughness ($R_q$) value of 0.15 nm for the dry oxidized silicon dioxide ($SiO_2$) surface indicates that the surface has a very low level of roughness. In general, this value suggests that the surface is quite smooth on the nanoscale. The fact that such a low $R_q$ value was obtained after dry oxidation of $SiO_2$ is a positive indicator of high-quality oxidation. It suggests that the oxidation process resulted in a smooth and uniform oxide layer with minimal surface irregularities.

In some implementations, the bonding processes may include depositing a layer or film of amorphous silicon (a-Si). To improve the bonding, a hydrogen-free ultra-thin a-Si layer of about 2-5 nm can deposited at room temperature on the exposed layer of the optically coated glass wafer. Such deposition made be achieved using a radio-frequency (RF) magnetron sputtering method. Without applying the a-Si film, both the bond efficiency and bond strength may be reduced. The deposited a-Si film may exhibit a surface roughness of less than 0.5 nm and can seamlessly integrate with high temperature processing procedures due to its well-matched thermal expansion across the bonded layers and minimal thermal strain. To form the a-Si layer, a 2-inch pure silicon target (99.995% purity) was bonded to copper (Cu) backing plate was purchased from AJA International, Inc. The bonded target was then used to deposit the a-Si layer. To enhance adhesion properties and reduce surface roughness, an in-situ pre-etching process may be conducted for about 300 seconds to remove surface contaminants and/or other irregularities between the a-Si interlayer and the topmost layer (e.g., a $SiO_2$ layer) of the optical coating. The pre-etching process may include applying 50 watts of power using a mixture of Ar and $O_2$ at a pressure of 30 mTorr (i.e., 4.00 Pa). The power and pressure parameters may be selected by optimization processes to achieve the desired etching rate and surface modification while avoiding excessive damage to the underlying layers. The a-Si thin film layer may be deposited exclusively in an argon gas environment, with a constant pressure of 3 mTorr (i.e., 0.400 Pa) maintained during the deposition process. Deposition times range from 100 to 300 seconds may be employed to attain varying thicknesses.

Upon completion of the a-Si deposition, a dicing saw may be used to cut the multilayer coated glass wafer and silicon wafers into suitable sizes (e.g., dimensions of 10 mm×20 mm). After dicing, the $SiO_2$ coated silicon and glass chips can be cleaned ultrasonically by solvent cleaning using methanol, acetone, isopropanol, and deionized water. Each of the cleaning may occur for 10 minutes. The chips may then be dried with $N_2$ gas to remove the particles and other contaminants on their surfaces. Further adherence of any dust particles/residues on the surfaces from the environment may be cleaned with methanol, acetone, and isopropanol using cleanroom swabs (e.g., laundered knitted polyester from Berkshire Engineered). The substrates may then be finally rinsed with deionized water. Immediately after $N_2$ drying, the chips can be transferred into the plasma activation chamber to avoid further surface contamination. The surface activation may be accomplished using a wafer level plasma cleaner tool. Prior to bonding, a pair of chip surfaces were activated in a plasma treatment using an oxygen plasma for 60 seconds and a nitrogen plasma for 60 seconds. The RF power of the plasma cleaner can be set at about 400 watts, and the chamber pressure inside maintained at about 360 mTorr (i.e., 48.0 Pa). Oxygen and nitrogen gas are introduced into the plasma treatment chamber at a volume rate of about 180 and 90 sccm. After activation by plasma exposure, the pair of chips are removed from the plasma cleaner. Since their activated surfaces are highly hydrophilic, no further hydroxylation is involved (e.g. by rinsing and/or dipping an activated surface in DI water).

The chips can be brought into contact at room temperature by placing the silicon chip with the activated $SiO_2$ surface facing upwards, while the glass with a-Si/AR coating surface placed on the top. As soon as the contact is initiated, the interference fringe pattern between the layers can be observed. To enhance the strength of the pre-contact bond, a firm pressure may be applied by pressing the altered surfaces against each other. A complete tight seal between the two activated surfaces is formed without any fringes and/or unbonded area. The seal is also uniform and lacks bubbles, such as due to the gas entrapped between the two-mating a-Si//$SiO_2$ surfaces.

However, in certain cases, the bonding strength may be reduced because of the hydrogen bonds and low bond energy of Si—OH. An increased bonding strength may be achieved when the plasma activation process is combined with a low temperature, electric field assisted bonding process, resulting in a hybrid bonding process. As such, the bonding mechanism may include a hybrid bonding process between the AR/glass/AR/a-Si//$SiO_2$/Si that can involve intricate interplay between charges as well as chemical reactions at the interface. The resulting electrostatic interactions and chemical affinities facilitate the formation of covalent bonds—e.g., siloxane Si—O—Si and nitroso bonds—at the interface between glass/a-Si//$SiO_2$/Si. For example, a sequential oxygen-nitrogen ($O_2/N_2$) plasma treatment may be employed to modify the bonding surfaces of the chips before hybrid bonding. In some instances, an ex-situ oxygen-nitrogen plasma may be used to treat a silicon surface with a native oxide surface or a thermally oxidized surface (e.g. via LPCVD) to form a few nm of a non-stoichiometric silicon oxynitride ($SiO_xN_y$) layer. This silicon oxynitride layer may enhance the resulting bond (e.g., in strength, hermeticity, etc.). In some instances, an amorphous silicon thin film is used as an interfacial layer. Amorphous silicon films may use the same plasma process as the surface of the film may also possess a native oxide surface. The films may have a thickness ranging from 10 to 100 nm as well as a low surface roughness. The amorphous silicon thin film, when treated with an ex-situ oxygen-nitrogen ($O_2/N_2$) plasma treatment, can be used to enhance the bond strength of glass//a-Si/glass wafer assemblies, as the amorphous silicon may act as a very thin (e.g., 10 nm-100 nm) adhesion layer.

The pre-bonded chips can be placed between two plates (e.g., graphite as anode and metallic disk as a cathode) that are connected to a DC power supply to initiate the low temperature hybrid bonding processes. The bonding process parameters are identified as bonding temperature, voltage, bonding time, which can influence the bond quality. In many implementations, the voltage and the bonding time may be set at values acceptable to industrial manufacturing processes. For example, the bottom $SiO_2$/Si and the a-Si/AR/glass chips may first be connected to the positive and negative electrodes respectively. The bonded pairs may then be heated simultaneously to increase the mobility of the positive ions in the glass substrates. The temperature is slowly ramped up in steps of 100° C., which may avoid the residual stress and the unwanted wafer curvature of the pre-bonded wafer pair. The temperature can be maintained constant at least for 15 mins to ensure temperature uniformity before applying the high voltage. When the temperature is stable, a DC voltage of 900-1200 V can be applied to the electrodes and the current measured over the bonding time of 90 minutes. The bond process is completed when the current decays to a residual value (e.g., 0.002 mA). No external mechanical forces are applied to put the wafers in contact during the bonding process. Moreover, subsequent cooling down to room temperature of the bonded layers can be done naturally to prevent the buildup of thermal stresses. Such a natural cooling may also prevent the breakup of any bond formed during the cooling process from the temperature at which the bonding took place.

Figure 9A:
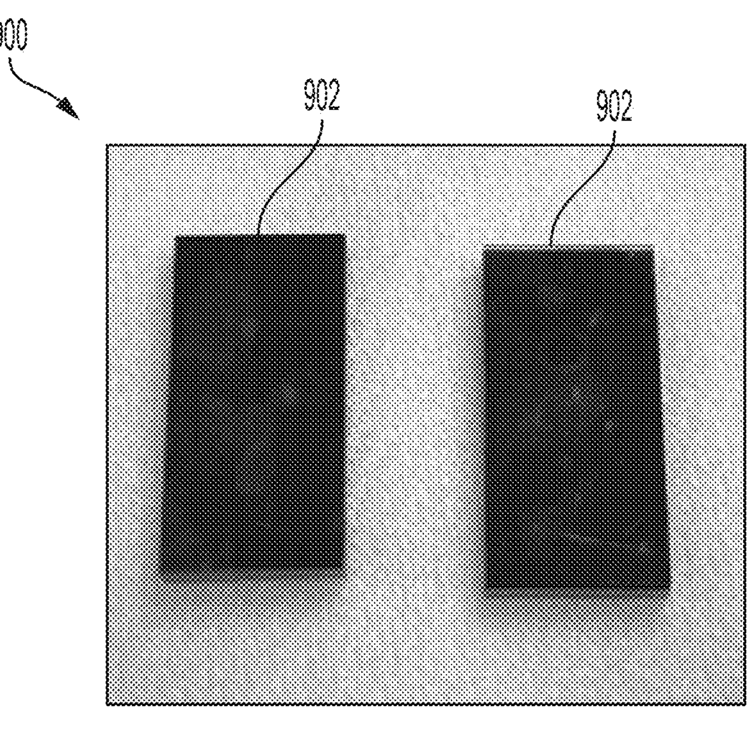
FIG. 9A is a photograph of an example antireflection structure that is based on six antireflection layers/glass/six antireflection layers/a-Si//$SiO_2$/Si.
Figure 9B:
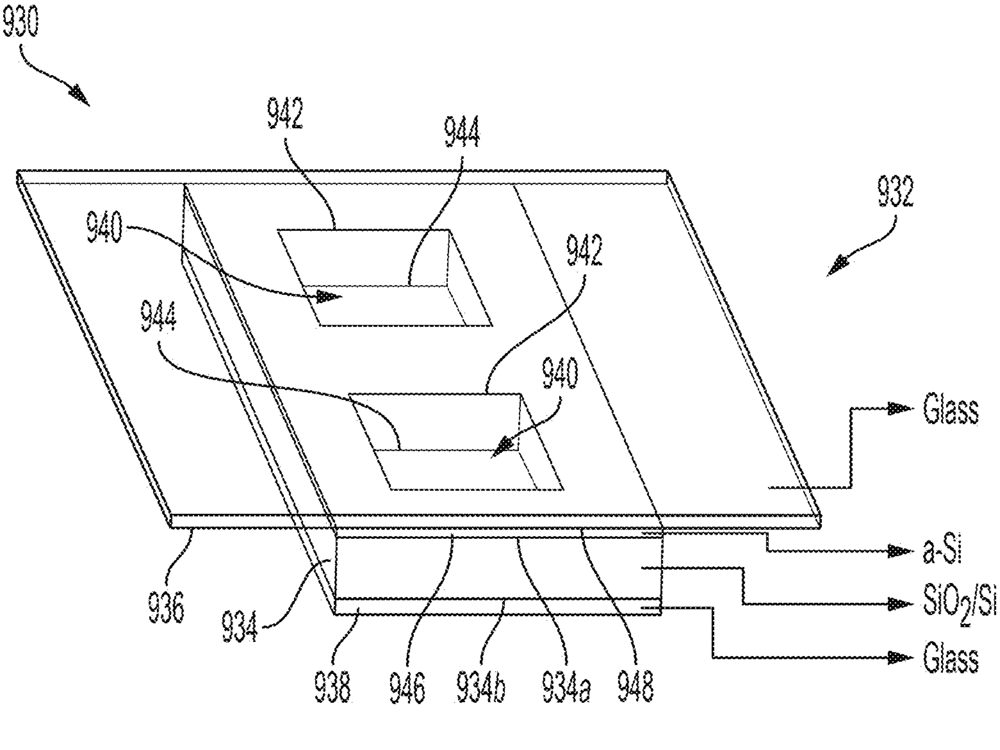
FIG. 9B is a schematic diagram, in perspective view, of an example wafer bonding architecture.
Figure 9C:
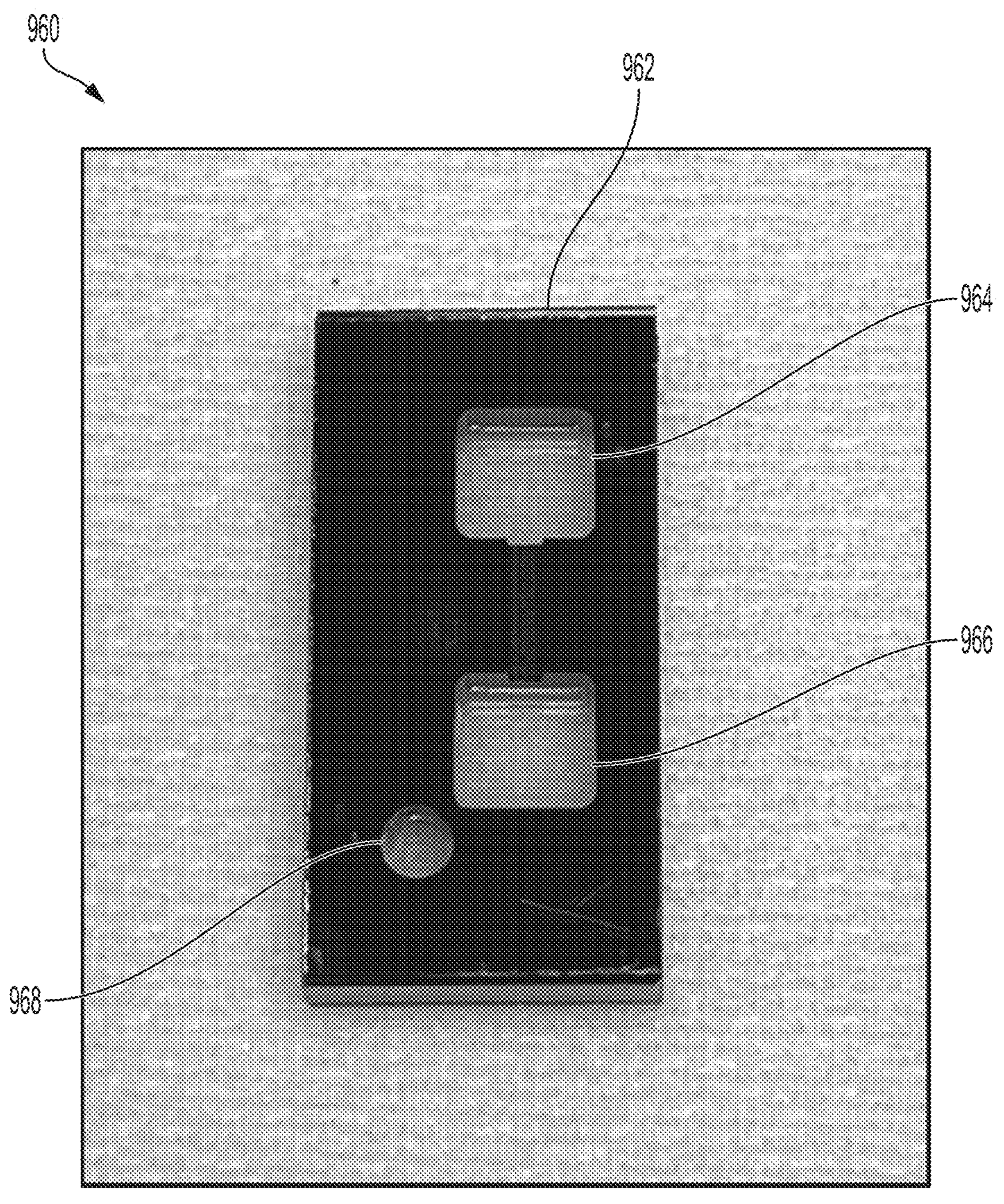
FIG. 9C is a photograph of an example vapor cell that includes two cavities and a side pocket connected thereto and further includes an integrated antireflection structure that is based four antireflection layers/glass/four antireflection layers/a-Si//$SiO_2$/glass.

FIGS. 9A-9C present example optical structures after low temperature hybrid bonding at 250° C. More specifically, FIG. 9A presents a photograph 900 of an example antireflection structure 902 that is based on six antireflection layers/glass/six antireflection layers/a-Si//$SiO_2$/Si. FIG. 9B presents a schematic diagram, in perspective view, of an example wafer bonding architecture 930. The example wafer bonding architecture 930 includes a vapor cell 932 having a dielectric body 934 and two optical windows, i.e., first and second optical windows 936, 938. The dielectric body 934 is formed of silicon (e.g., is a silicon dielectric body) and has top and bottom exterior surfaces 934*a*, 934*b*. A silicon oxide layer of the dielectric body 934 defines the top exterior surface 934*a*. Moreover, the first and second optical windows 936, 938 are bonded to, respectively, the top and bottom exterior surfaces 934*a*, 934*b*. The dielectric body 934 also includes two cavities 940 that each extend between respective pairs of first and second openings 942, 944 on respectively, the top and bottom exterior surfaces 934*a*, 934*b*. In the example wafer bonding architecture 930, the vapor cell 932 includes an adhesion layer 946 that is formed of amorphous silicon. The adhesion layer 946 may improve the bond along a bonded interface 948 between the first optical window 936 and the top exterior surface 934*a* of the dielectric body 934. Such improvements may include an increased bond strength along the bonded interface 948 and an increased hermiticity of a seal around the two cavities 940. FIG. 9C presents a photograph 960 of an example vapor cell 962 that includes two cavities 964, 966 and a side pocket 968 connected thereto and further includes an integrated antireflection structure that is based four antireflection layers/glass/four antireflection layers/a-Si//$SiO_2$/glass.

Figure 10A:
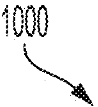
FIG. 10A is a photograph of an example antireflection structure that is based on six antireflection layers/glass/six antireflection layers/a-Si//$SiO_2$/Si and in which the example antireflection structure is being subjected to a crack opening method using a razor blade.
Figure 10A:
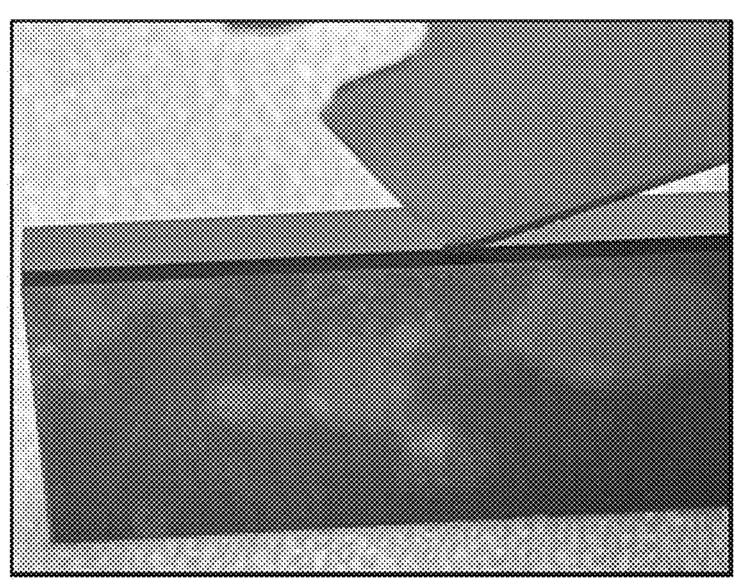
Figure 10B:
FIG. 10B is a photograph of the bulk fracture surfaces of an example pair of substrates bonded together at a bonding temperature of 250° C.
Figure 10B:
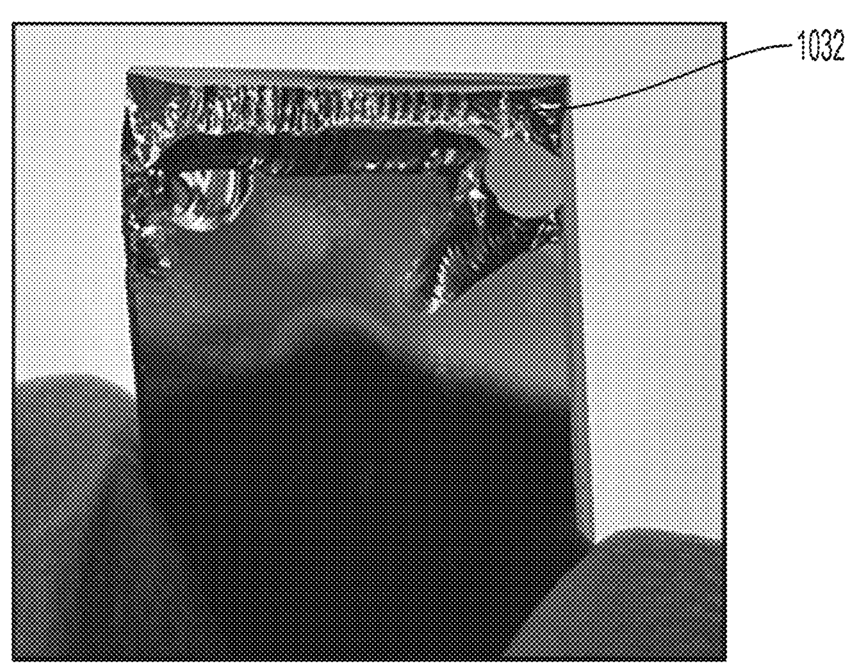
Figure 10C:
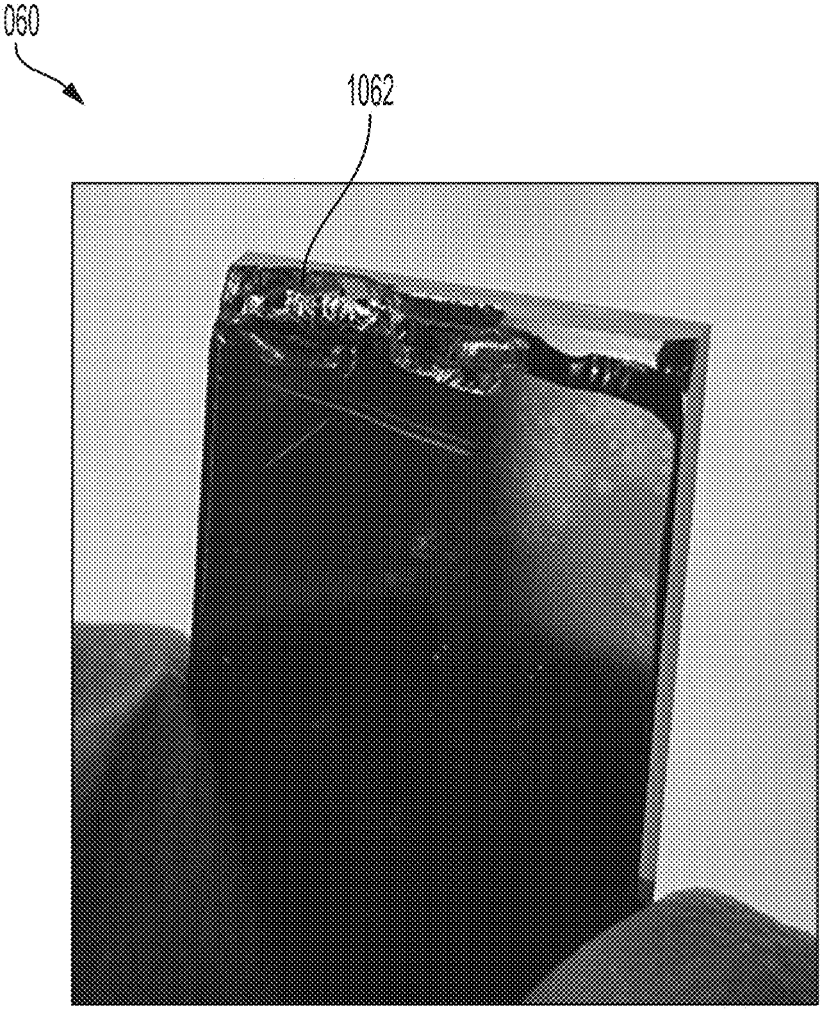
FIG. 10C is a photograph of the bulk fracture surfaces of a second example pair of substrates bonded together at a bonding temperature of 250° C.

Upon completion of the bonding processes, the bonded pairs—e.g., pairs defined by an optical window bonded to a silicon wafer frame—were subjected to crack-opening test (Maszara razor blade method) to evaluate their bond strength. The test involves inserting a razor blade between the two bonded wafers, pulling them apart from each other, and then assessing fracture toughness and/or interface integrity of the bonded wafers. No fringes formed, nor did crack propagation occur during the insertion of the razor blade at various regions. The test indicates that the bond strength remains significantly high even at lower temperatures, as fractures occurred predominantly within the bulk glass rather than at the interface between the two mating wafers. The example results of the test are shown in FIGS. 10A-10C. FIG. 10A presents a photograph 1000 of an example antireflection structure that is based on six antireflection layers/glass/six antireflection layers/a-Si//$SiO_2$/Si. Here, the example antireflection structure is being subjected to a crack opening method using a razor blade. FIG. 10B presents a photograph 1030 of the bulk fracture surfaces 1032 of an example pair of substrates bonded together at a bonding temperature of 250° C., and FIG. 10C presents a photograph 1060 of the bulk fracture surfaces 1062 of a second example pair of substrates bonded together at a bonding temperature of 250° C.

In some aspects of what is described, a vapor cell may also be described by the following examples:

Example 1. A vapor cell, comprising:
- a dielectric body having a cavity and an exterior surface that defines an opening to the cavity;
- a vapor or a source of the vapor residing in the cavity, the vapor or the source of the vapor comprising alkali metal atoms; and
- an optical window comprising:
  - a substrate having first and second substrate surfaces on opposite sides of the substrate,
  - a first multilayer coating disposed on the first substrate surface and defining a first window surface of the optical window, the first window surface bonded to the exterior surface of the dielectric body and extending across the opening, the first multilayer coating applying a first stress to the substrate, and
  - a second multilayer coating disposed on the second substrate surface and defining a second window surface of the optical window, the second window surface facing an exterior of the vapor cell, the second multilayer coating applying a second stress to the substrate that counteracts the first stress.

Example 2. The vapor cell of example 1, wherein the first multilayer coating or the second multilayer coating comprises a sequence of layers having respective layer stresses that alternate between tension and compression.

Example 3. The vapor cell of example 1 or example 2, wherein the first and second stresses oppose each other and result in a net stress applied to the substrate of no greater than 100 MPa.

Example 4. The vapor cell of example 3, wherein the net stress is no greater than 10 MPa.

Example 5. The vapor cell of example 1 or any one of examples 2-4, wherein each layer in the first and second multilayer coatings has a layer stress state no greater than 10 MPa.

Example 6. The vapor cell of example 1 or any one of examples 2-5,
- wherein the alkali metal atoms have a target optical transition when in a vapor state;
- wherein the substrate is transparent to a laser wavelength that is matched to the target optical transition; and
- wherein the first and second multilayer coatings each comprise a first type of layer and a second type of layer, the first type of layer having a first index of refraction at the laser wavelength in a first range from 1.9 to 4.5, the second type of layer having a second index of refraction at the laser wavelength in a second range from 1.2 to 1.9.

Example 7. The vapor cell of example 6, wherein the substrate has a substrate index of refraction at the laser wavelength in a substrate range from 1.3 to 1.6.

Example 8. The vapor cell of example 6 or example 7, wherein the first multilayer coating or the second multilayer coating comprises an alternating sequence of first and second types of layers that starts with a first instance of the first type of layer; and wherein the first instance of the first type of layer is disposed on the first substrate surface for the first multilayer coating and on the second substrate surface for the second multilayer coating.

Example 9. The vapor cell of example 6 or example 7, wherein the first and second multilayer coatings each comprise a third type of layer that has a third index of refraction at the laser wavelength, the third index of refraction having a magnitude between the first and second indices of refraction.

Example 10. The vapor cell of example 9, wherein the first multilayer coating or the second multilayer coating comprises:

a base instance of the third type of layer that is disposed on the first substrate surface for the first multilayer coating or on the second substrate surface for the second multilayer coating; and an alternating sequence of first and second types of layers that starts with a first instance of the first type of layer, the first instance of the first type of layer disposed on the base instance of the third type of layer.

Example 11. The vapor cell of example 9, wherein the first multilayer coating or the second multilayer coating comprises:

a base instance of the third type of layer that is disposed on the first substrate surface for the first multilayer coating or on the second substrate surface for the second multilayer coating; and a repeating sequence of layers in which each sequence is defined, in successive order, by one first type of layer, one third type of layer, and one second type of layer, the repeating sequence of layers has a first instance of the first type of layer that is formed on the base instance of the third type of layer.

Example 12. The vapor cell of example 6 or any one of examples 7-11, wherein the target optical transition comprises probe and coupling optical transitions of the alkali metal atoms when in the vapor state; and wherein the laser wavelength comprises probe and coupling laser wavelengths that are matched to, respectively, the probe and coupling optical transitions.

Example 13. The vapor cell of example 1 or any one of examples 2-12, wherein the first multilayer coating comprises an end layer that is formed of a material chemically inert to the alkali metal atoms; and wherein the end layer comprises:

a bonding portion that is bonded to the exterior surface of the dielectric body, and a covering portion that extends across the opening to the cavity.

Example 14. The vapor cell of example 1 or any one of examples 2-13, wherein the first multilayer coating comprises an end layer that is formed of amorphous silicon; and wherein the end layer comprises:

a bonding portion that is bonded to the exterior surface of the dielectric body, and a covering portion that extends across the opening to the cavity.

Example 15. The vapor cell of example 14, wherein the dielectric body is a silicon dielectric body and comprises a silicon oxide layer that defines the exterior surface of the dielectric body.

Example 16. The vapor cell of example 14, wherein the dielectric body comprises silicon oxide.

Example 17. The vapor cell of example 1 or any one of examples 2-16, wherein the first multilayer coating has a root mean square (RMS) surface roughness, $R_q$, no greater than 1 nanometer.

Example 18. The vapor cell of example 1 or any one of examples 2-17, wherein the alkali metal atoms have a target optical transition when in a vapor state, and the substrate is transparent to a laser wavelength that is matched to the target optical transition; and wherein the first and second multilayer coatings are each configured as an antireflection coating for the laser wavelength.

Example 19. The vapor cell of example 1 or any one of examples 2-18, wherein the cavity extends partially through the dielectric body, and the optical window encloses the cavity.

Example 20. The vapor cell of example 1 or any one of examples 2-18, wherein the exterior surface of the dielectric body is a first exterior surface, the opening is a first opening, and the optical window is a first optical window;

wherein the dielectric body comprises a second opening that is defined by a second exterior surface of the dielectric body, the cavity extending through the dielectric body from the first opening to the second opening; and wherein the vapor cell comprises a second optical window that has:

a second substrate having third and fourth substrate surfaces on opposite sides of the second substrate, a third multilayer coating disposed on the third substrate surface and defining a third window surface of the second optical window, the third window surface bonded to the second exterior surface of the dielectric body and extending across the second opening, the third multilayer coating applying a third stress to the second substrate, and a fourth multilayer coating disposed on the fourth substrate surface and defining a fourth window surface of the second optical window, the fourth window surface facing the exterior of the vapor cell, the fourth multilayer coating applying a fourth stress to the second substrate that counteracts the third stress.

In some aspects of what is described, a method of manufacturing a vapor cell may be described by the following examples:

Example 21. A method of manufacturing a vapor cell, comprising:

fabricating an optical window by:

obtaining a substrate having first and second substrate surfaces on opposite sides of the substrate, forming a first multilayer coating on the first substrate surface, thereby defining a first window surface of the optical window, the first multilayer coating applying a first stress to the substrate, and forming a second multilayer coating on the second substrate surface, thereby defining a second window surface of the optical window, the second multilayer coating applying a second stress to the substrate that counteracts the first stress;

obtaining a dielectric body that has a cavity and an exterior surface that defines an opening to the cavity; and bonding the first window surface of the optical window to the exterior surface of the dielectric body, the first window surface extending across the opening to the cavity, the second window surface on a side of the optical window opposite the first window surface.

Example 22. The method of example 21, wherein the first multilayer coating or the second multilayer coating comprises a sequence of layers having respective layer stresses that alternate between tension and compression.

Example 23. The method of example 21 or example 22, wherein the first and second stresses oppose each other and result in a net stress applied to the substrate of no greater than 100 MPa.

Example 24. The method of example 23, wherein the net stress is no greater than 10 MPa.

Example 25. The method of example 21 or any one of examples 22-24, wherein each layer in the first and second multilayer coatings has a layer stress of no greater than 10 MPa.

Example 26. The method of example 21 or any one of examples 22-25, wherein the substrate is transparent to a laser wavelength that is matched to a target optical transition of alkali metal atoms when in a vapor state; and wherein the first and second multilayer coatings each comprise a first type of layer and a second type of layer, the first type of layer having a first index of refraction at the laser wavelength in a first range from 1.9 to 4.5, the second type of layer having a second index of refraction at the laser wavelength in a second range from 1.2 to 1.9.

Example 27. The method of example 26, wherein the substrate has a substrate index of refraction at the laser wavelength in a substrate range from 1.3 to 1.6.

Example 28. The method of example 26 or example 27, wherein forming the first multilayer coating or forming the second multilayer coating comprises alternately forming instances of the first and second types of layers on top of each other, thereby forming an alternating sequence of first and second types of layers that starts with a first instance of the first type of layer; and wherein the first instance of the first type of layer is formed on the first substrate surface for the first multilayer coating and on the second substrate surface for the second multilayer coating.

Example 29. The method of example 26 or example 27, wherein the first and second multilayer coatings each comprise a third type of layer that has a third index of refraction at the laser wavelength, the third index of refraction having a magnitude between the first and second indices of refraction.

Example 30. The method of example 29, wherein forming the first multilayer coating or forming the second multilayer coating comprises:

forming a base instance of the third type of layer on the first substrate surface for the first multilayer coating or the second substrate surface for the second multilayer coating; and alternately forming instances of the first and second types of layers on top of each other, thereby forming an alternating sequence of first and second types of layers that starts with a first instance of the first type of layer, the first instance of the first layer formed on the base instance of the third type of layer.

Example 31. The method of example 29, forming the first multilayer coating or forming the second multilayer coating comprises:

forming a base instance of the third type of layer on the first substrate surface for the first multilayer coating or the second substrate surface for the second multilayer coating; and successively forming, in order and on top of each other, one first type of layer, one third type of layer, and one second type of layer, thereby forming a repeating sequence of layers, the repeating sequence of layers has a first instance of the first type of layer that is formed on the base instance of the third type of layer.

Example 32. The method of example 26 or any one of examples 27-31, wherein the target optical transition comprises probe and coupling optical transitions of the alkali metal atoms when in the vapor state, and wherein the laser wavelength comprises probe and coupling laser wavelengths that are matched to, respectively, the probe and coupling optical transitions.

Example 33. The method of example 21 or any one of examples 22-32, wherein the first multilayer coating comprises an end layer that is formed of a material chemically inert to the alkali metal atoms; and wherein the end layer comprises:

a bonding portion that is bonded to the exterior surface of the dielectric body, and a covering portion that extends across the opening to the cavity.

Example 34. The method of example 21 or any one of examples 22-33, wherein the first multilayer coating comprises an end layer that is formed of amorphous silicon; and wherein the end layer comprises:

a bonding portion that is bonded to the exterior surface of the dielectric body, and a covering portion that extends across the opening to the cavity.

Example 35. The method of example 34, wherein the dielectric body is a silicon dielectric body and comprises a silicon oxide layer that defines the exterior surface of the dielectric body.

Example 36. The method of example 34, wherein the dielectric body comprises silicon oxide.

Example 37. The method of example 21 or any one of examples 22-36, comprising:

altering an exposed surface of the first multilayer coating to have a root mean square (RMS) surface roughness, $R_q$, no greater than 1 nanometer.

Example 38. The method of example 21 or any one of examples 22-37, wherein the alkali metal atoms have a target optical transition when in a vapor state, and the substrate is transparent to a laser wavelength that is matched to the target optical transition; and wherein the first and second multilayer coatings, when formed, are each configured as an antireflection coating for the laser wavelength.

Example 39. The method of example 21 or any one of examples 22-38, wherein the cavity extends partially through the dielectric body;

wherein the method comprises disposing a vapor or a source of the vapor in the cavity, the vapor or the source of the vapor comprising alkali metal atoms; and wherein bonding the first window surface comprises enclosing the cavity with the optical window.

Example 40. The method of example 21 or any one of examples 22-38, wherein the exterior surface of the dielectric body is a first exterior surface, the opening is a first opening, and the optical window is a first optical window;

wherein the dielectric body comprises a second opening that is defined by a second exterior surface of the dielectric body, the cavity extending through the dielectric body from the first opening to the second opening; and wherein the method comprises:

fabricating a second optical window by:

obtaining a second substrate having third and fourth substrate surfaces on opposite sides of the second substrate, forming a third multilayer coating on the third substrate surface, thereby defining a third window surface of the second optical window, the third multilayer coating applying a third stress to the second substrate, and forming a fourth multilayer coating on the fourth substrate surface, thereby defining a fourth window surface of the second optical window, the fourth multilayer coating applying a fourth stress to the second substrate that counteracts the third stress;

disposing a vapor or a source of the vapor in the cavity, the vapor or the source of the vapor comprising alkali metal atoms; and bonding the third window surface of the second optical window to the second exterior surface of the dielectric body to enclose the cavity, the third window surface extending across the second opening to the cavity, the fourth window surface on a side of the second optical window opposite the third window surface.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A vapor cell, comprising:

a dielectric body having a cavity and an exterior surface that defines an opening to the cavity;

a vapor or a source of the vapor residing in the cavity, the vapor or the source of the vapor comprising alkali metal atoms; and an optical window comprising:

a substrate having first and second substrate surfaces on opposite sides of the substrate, a first multilayer coating disposed on the first substrate surface and defining a first window surface of the optical window, the first window surface bonded to the exterior surface of the dielectric body and extending across the opening to the cavity, the first multilayer coating applying a first stress to the substrate, and a second multilayer coating disposed on the second substrate surface and defining a second window surface of the optical window, the second window surface facing an exterior of the vapor cell, the second multilayer coating applying a second stress to the substrate that counteracts the first stress to the substrate.

2. The vapor cell of claim 1, wherein the first multilayer coating or the second multilayer coating comprises a sequence of layers having respective layer stresses that alternate between tension and compression.

3. The vapor cell of claim 1, wherein the first and second stresses to the substrate oppose each other and result in a net stress applied to the substrate of no greater than 100 MPa.

4. The vapor cell of claim 3, wherein the net stress applied to the substrate is no greater than 10 MPa.

5. The vapor cell of claim 1, wherein each layer in the first and second multilayer coatings has a layer stress of no greater than 10 MPa.

6. The vapor cell of claim 1, wherein the alkali metal atoms have a target optical transition when in a vapor state;

wherein the substrate is transparent to a laser wavelength that is matched to the target optical transition; and wherein the first and second multilayer coatings each comprise a first type of layer and a second type of layer, the first type of layer having a first index of refraction at the laser wavelength in a first range from 1.9 to 4.5, the second type of layer having a second index of refraction at the laser wavelength in a second range from 1.2 to 1.9.

7. The vapor cell of claim 6, wherein the substrate has a substrate index of refraction at the laser wavelength in a substrate range from 1.3 to 1.6.

8. The vapor cell of claim 6, wherein the first and second multilayer coatings each comprise a third type of layer that has a third index of refraction at the laser wavelength, the third index of refraction having a magnitude between the first and second indices of refraction at the laser wavelength.

9. The vapor cell of claim 1, wherein the first multilayer coating comprises an end layer that is formed of a material chemically inert to the alkali metal atoms; and wherein the end layer comprises:

a bonding portion that is bonded to the exterior surface of the dielectric body, and a covering portion that extends across the opening to the cavity.

10. The vapor cell of claim 1, wherein the first multilayer coating comprises an end layer that is formed of amorphous silicon; and wherein the end layer comprises:

a bonding portion that is bonded to the exterior surface of the dielectric body, and a covering portion that extends across the opening to the cavity.

11. The vapor cell of claim 10, wherein the dielectric body is a silicon dielectric body and comprises a silicon oxide layer that defines the exterior surface of the dielectric body.

12. The vapor cell of claim 10, wherein the dielectric body comprises silicon oxide.

13. The vapor cell of claim 1, wherein the first multilayer coating has a root mean square (RMS) surface roughness, $R_q$, no greater than 1 nanometer.

14. The vapor cell of claim 1, wherein the alkali metal atoms have a target optical transition when in a vapor state, and the substrate is transparent to a laser wavelength that is matched to the target optical transition; and wherein the first and second multilayer coatings are each configured as an antireflection coating for the laser wavelength.

15. A method of manufacturing a vapor cell, comprising:

fabricating an optical window by:

obtaining a substrate having first and second substrate surfaces on opposite sides of the substrate, forming a first multilayer coating on the first substrate surface, thereby defining a first window surface of the optical window, the first multilayer coating applying a first stress to the substrate, and forming a second multilayer coating on the second substrate surface, thereby defining a second window surface of the optical window, the second multilayer coating applying a second stress to the substrate that counteracts the first stress to the substrate;

obtaining a dielectric body that has a cavity and an exterior surface that defines an opening to the cavity; and bonding the first window surface of the optical window to the exterior surface of the dielectric body, the first window surface extending across the opening to the cavity, the second window surface on a side of the optical window opposite the first window surface.

16. The method of manufacturing a vapor cell of claim 15, wherein the first multilayer coating or the second multilayer coating comprises a sequence of layers having respective layer stresses that alternate between tension and compression.

17. The method of manufacturing a vapor cell of claim 15, wherein the first and second stresses to the substrate oppose each other and result in a net stress applied to the substrate of no greater than 100 MPa.

18. The method of manufacturing a vapor cell of claim 17, wherein the net stress applied to the substrate is no greater than 10 MPa.

19. The method of manufacturing a vapor cell of claim 15, wherein each layer in the first and second multilayer coatings has a layer stress of no greater than 10 MPa.

20. The method of manufacturing a vapor cell of claim 15, wherein the substrate is transparent to a laser wavelength that is matched to a target optical transition of alkali metal atoms when in a vapor state; and wherein the first and second multilayer coatings each comprise a first type of layer and a second type of layer, the first type of layer having a first index of refraction at the laser wavelength in a first range from 1.9 to 4.5, the second type of layer having a second index of refraction at the laser wavelength in a second range from 1.2 to 1.9.

21. The method of manufacturing a vapor cell of claim 20, wherein the substrate has a substrate index of refraction at the laser wavelength in a substrate range from 1.3 to 1.6.

22. The method of manufacturing a vapor cell of claim 20, wherein the first and second multilayer coatings each comprise a third type of layer that has a third index of refraction at the laser wavelength, the third index of refraction having a magnitude between the first and second indices of refraction at the laser wavelength.

23. The method of manufacturing a vapor cell of claim 15, wherein the first multilayer coating comprises an end layer that is formed of a material chemically inert to the alkali metal atoms; and wherein the end layer comprises:

a bonding portion that is bonded to the exterior surface of the dielectric body, and a covering portion that extends across the opening to the cavity.

24. The method of manufacturing a vapor cell of claim 15, wherein the first multilayer coating comprises an end layer that is formed of amorphous silicon; and wherein the end layer comprises:

a bonding portion that is bonded to the exterior surface of the dielectric body, and a covering portion that extends across the opening to the cavity.

25. The method of manufacturing a vapor cell of claim 24, wherein the dielectric body is a silicon dielectric body and comprises a silicon oxide layer that defines the exterior surface of the dielectric body.

26. The method of manufacturing a vapor cell of claim 24, wherein the dielectric body comprises silicon oxide.

27. The method of manufacturing a vapor cell of claim 15, comprising:

altering an exposed surface of the first multilayer coating to have a root mean square (RMS) surface roughness, $R_q$, no greater than 1 nanometer.

28. The method of manufacturing a vapor cell of claim 15, wherein the alkali metal atoms have a target optical transition when in a vapor state, and the substrate is transparent to a laser wavelength that is matched to the target optical transition; and wherein the first and second multilayer coatings, when formed, are each configured as an antireflection coating for the laser wavelength.

* * * * *